US011799064B2

(12) United States Patent
Nakabayashi et al.

(10) Patent No.: US 11,799,064 B2
(45) Date of Patent: Oct. 24, 2023

(54) LIGHT-EMITTING UNIT AND SURFACE-EMISSION LIGHT SOURCE

(71) Applicant: NICHIA CORPORATION, Anan (JP)

(72) Inventors: Takuya Nakabayashi, Tokushima (JP); Toshinobu Katsumata, Anan (JP); Noriaki Hiraide, Suwa-gun (JP)

(73) Assignee: Nichia Corporation, Anan (JP)

( * ) Notice: Subject to any disclaimer, the term of this patent is extended or adjusted under 35 U.S.C. 154(b) by 9 days.

(21) Appl. No.: 17/842,925

(22) Filed: Jun. 17, 2022

(65) Prior Publication Data

US 2022/0310896 A1 Sep. 29, 2022

Related U.S. Application Data

(63) Continuation of application No. 16/945,446, filed on Jul. 31, 2020, now Pat. No. 11,393,965.

(30) Foreign Application Priority Data

Aug. 2, 2019 (JP) .................................. 2019-143128
Apr. 27, 2020 (JP) .................................. 2020-078314

(51) Int. Cl.
*H01L 33/62* (2010.01)
*H01L 33/48* (2010.01)
(Continued)

(52) U.S. Cl.
CPC ............ *H01L 33/62* (2013.01); *H01L 27/156* (2013.01); *H01L 33/486* (2013.01);
(Continued)

(58) Field of Classification Search
CPC ..... H01L 33/62; H01L 27/156; H01L 33/486; H01L 33/502; H01L 33/60; H01L 33/504;
(Continued)

(56) References Cited

U.S. PATENT DOCUMENTS

2008/0303977 A1   12/2008   Sekiguchi et al.
2010/0187975 A1   7/2010    Tsukahara et al.
(Continued)

FOREIGN PATENT DOCUMENTS

CN          108776411 A     11/2018
JP          2002-335020 A   11/2002
(Continued)

OTHER PUBLICATIONS

Office Action dated Nov. 2, 2021 in co-pending U.S. Appl. No. 16/945,446.

*Primary Examiner* — Jonathan Han
(74) *Attorney, Agent, or Firm* — Birch, Stewart, Kolasch & Birch, LLP

(57) ABSTRACT

A light-emitting unit includes: a wiring board; a plurality of light-emitting elements provided on the wiring board and electrically coupled with a wire layer of the wiring board; a light reflecting member provided on the wiring board, the light reflecting member covering a lateral surface of each of the plurality of light-emitting elements; a light diffusing layer covering the plurality of light-emitting elements and the light reflecting member; a wavelength conversion layer located on or above the light diffusing layer; and a plurality of light reflecting layers located between the light diffusing layer and the wavelength conversion layer, each of the light reflecting layers being located above a corresponding one of the plurality of light-emitting elements. An upper surface of the light reflecting member has a recess which includes at least one concave surface, and there is a space between the concave surface and the light diffusing layer.

23 Claims, 12 Drawing Sheets

(51) Int. Cl.
  *H01L 33/50* (2010.01)
  *H05K 1/18* (2006.01)
  *H01L 33/60* (2010.01)
  *H01L 27/15* (2006.01)

(52) U.S. Cl.
  CPC ............ *H01L 33/502* (2013.01); *H01L 33/60* (2013.01); *H05K 1/189* (2013.01)

(58) Field of Classification Search
  CPC ................. H01L 33/507; H01L 33/508; H01L 2933/0091; H01L 25/0753; H05K 1/189; H05K 2201/10106; H05K 1/0274; H05K 3/284
  See application file for complete search history.

(56) References Cited

U.S. PATENT DOCUMENTS

| | | |
|---|---|---|
| 2010/0246160 A1 | 9/2010 | Ito et al. |
| 2011/0051044 A1 | 3/2011 | Segawa |
| 2011/0051411 A1 | 3/2011 | Kim et al. |
| 2011/0149198 A1 | 6/2011 | Kim et al. |
| 2011/0317096 A1 | 12/2011 | Yokota et al. |
| 2012/0224111 A1 | 9/2012 | Ohshima |
| 2015/0155450 A1 | 6/2015 | Oka |
| 2018/0080625 A1* | 3/2018 | Yamada ................ F21V 7/0083 |
| 2018/0175239 A1 | 6/2018 | Hayashi |
| 2018/0226014 A1* | 8/2018 | Komanduri ............... G09G 3/32 |
| 2019/0049651 A1* | 2/2019 | Yamamoto ................ F21S 2/00 |
| 2019/0097094 A1* | 3/2019 | Han .................... H01L 25/0753 |
| 2019/0243187 A1 | 8/2019 | Liu |

FOREIGN PATENT DOCUMENTS

| | | |
|---|---|---|
| JP | 2006-310045 A | 11/2006 |
| JP | 2008-304839 A | 12/2008 |
| JP | 2009-283438 A | 12/2009 |
| JP | 2010-170961 A | 8/2010 |
| JP | 2010-277983 A | 12/2010 |
| JP | 2011-053543 A | 3/2011 |
| JP | 2011-096494 A | 5/2011 |
| JP | 2012-069577 A | 4/2012 |
| JP | 2012-182023 A | 9/2012 |
| JP | 2012-221732 A | 11/2012 |
| JP | 2013-503431 A | 1/2013 |
| JP | 2013-175759 A | 9/2013 |
| JP | 2015-106641 A | 6/2015 |
| JP | 2017-028010 A | 2/2017 |
| JP | 2018-056367 A | 4/2018 |
| JP | 2018-139285 A | 9/2018 |
| JP | 2019-061954 A | 4/2019 |
| WO | WO 2011/021436 A1 | 2/2011 |

* cited by examiner

«LIGHT-EMITTING UNIT AND SURFACE-EMISSION LIGHT SOURCE

CROSS REFERENCE TO RELATED APPLICATIONS

This application is a Continuation of copending application Ser. No. 16/945,446, filed on Jul. 31, 2020, which claims priority under 35 U.S.C. § 119(a) to Japanese Patent Application No. 2020-78314, filed on Apr. 27, 2020, and Japanese Patent Application No. 2019-143128, filed on Aug. 2, 2019, all of which are hereby expressly incorporated by reference into the present application in their entireties.

BACKGROUND

The present disclosure relates to a light-emitting unit and a surface-emission light source.

Japanese Patent Publication No. 2013-175759 and Japanese Patent Publication No. 2002-335020 disclose light-emitting units which have a configuration where lateral surfaces of light-emitting elements are covered with a light reflecting member. By covering the lateral surfaces of the light-emitting elements with the light reflecting member, leakage of light from the lateral surfaces of the light-emitting elements can be suppressed and, as a result, the luminance can be improved.

SUMMARY

As a direct-lit backlight for display devices such as liquid crystal display devices, a light-emitting unit has been proposed in which a plurality of light-emitting elements are two-dimensionally arrayed. Such a light-emitting unit is required to have improved light extraction efficiency, further-reduced thickness, etc.

In a nonlimiting and illustrative embodiment, a light-emitting unit of the present disclosure includes: a wiring board; a plurality of light-emitting elements provided on the wiring board and electrically coupled with a wire layer of the wiring board; a light reflecting member provided on the wiring board, the light reflecting member covering a lateral surface of each of the plurality of light-emitting elements; a light diffusing layer covering the plurality of light-emitting elements and the light reflecting member; a wavelength conversion layer located on or above the light diffusing layer; and a plurality of light reflecting layers located between the light diffusing layer and the wavelength conversion layer, each of the light reflecting layers being located above a corresponding one of the plurality of light-emitting elements, wherein an upper surface of the light reflecting member has a recess which includes at least one concave surface, and a space is present between the concave surface and the light diffusing layer.

According to an exemplary embodiment of the present disclosure, a light-emitting unit is provided in which unevenness in luminance of light emitted from a light source is suppressed while the thickness and/or size can be reduced.

BRIEF DESCRIPTION OF THE DRAWINGS

FIG. 14 is a perspective view schematically showing a light diffusing layer 40 in a state where a plurality of light reflecting layers 60 are provided at predetermined positions on an upper surface 40a.

DETAILED DESCRIPTION

Embodiments of the present disclosure will now be described in detail with reference to the drawings. The following embodiments are illustrative, and the light-emitting unit of the present disclosure is not limited thereto. For example, the numerical values, shapes, materials, steps, and the order of steps, etc., to be shown in the following embodiments are merely examples, and various modifications can be made thereto so long as they do not lead to technical contradictions. The embodiments described below are merely illustrative, and various combinations are possible so long as they do not lead to technical contradictions.

The size, the shape, etc., of the components shown in the figures may be exaggerated for the ease of understanding, and they may not represent the size and the shape of the components, the size relationship therebetween in an actual light-emitting unit and an actual surface-emission light source. Some components may be omitted in order to prevent the figures from becoming excessively complicated.

In the following description, components of like functions may be denoted by like reference signs and may not be described redundantly. Terms indicating specific directions and positions (e.g., "upper", "lower", "right", "left", and other terms including such terms) may be used in the following description. Note however that these terms are used merely for the ease of understanding relative directions or positions in the figure being referred to. The arrangement of components in figures from documents other than the present disclosure, actual products, actual manufacturing apparatuses, etc., does not need to be equal to that shown in the figure being referred to, as long as it conforms with the directional or positional relationship as indicated by terms such as "upper" and "lower" in the figure being referred to. In the present disclosure, the term "parallel" encompasses cases where two straight lines, sides, planes, etc., are in the range of about 0±5°, unless otherwise specified. In the present disclosure, the term "perpendicular" or "orthogonal" encompasses cases where two straight lines, sides, planes, etc., are in the range of about 90±5°, unless otherwise specified.

1. Configuration of Light-Emitting Unit 200

Figure 1:
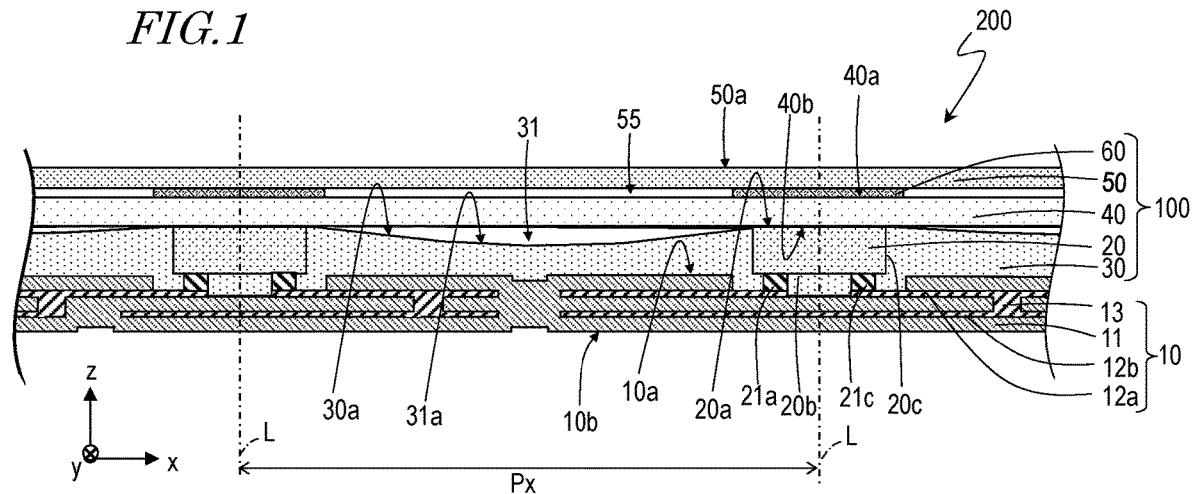
FIG. 1 is a cross-sectional view schematically showing an exemplary configuration of a light-emitting unit 200 of an embodiment of the present disclosure.
Figure 2:
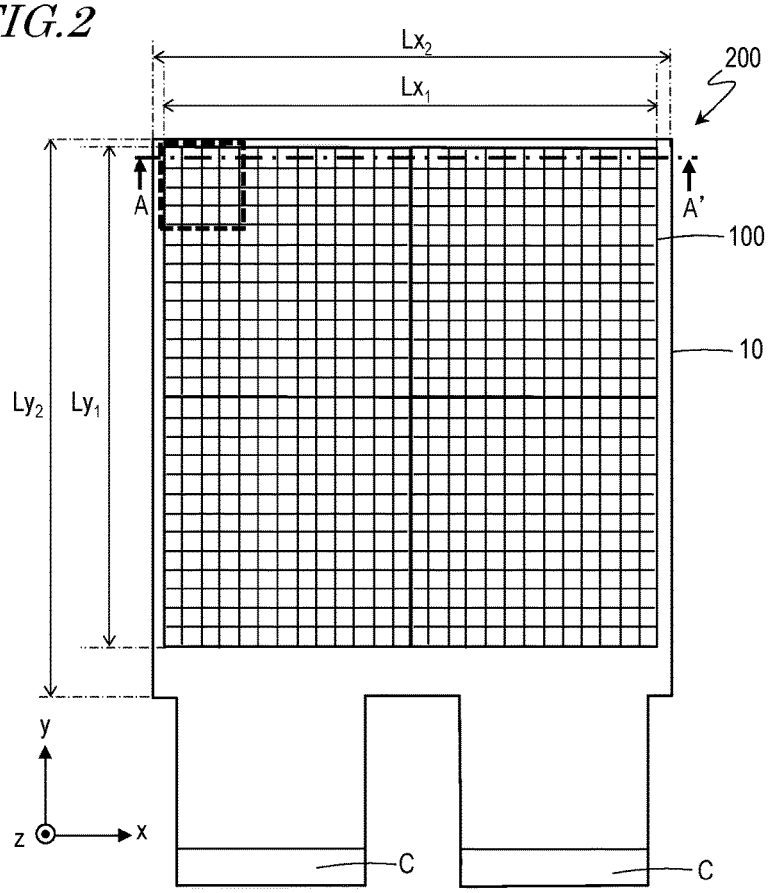
FIG. 2 is a schematic top view showing an exemplary external appearance of the light-emitting unit 200 of the present embodiment.

FIG. 1 is a cross-sectional view showing an exemplary configuration of a light-emitting unit 200 of an embodiment of the present disclosure. FIG. 2 is an illustrative top view of the light-emitting unit 200 of the present embodiment. The schematic cross section shown in FIG. 1 corresponds to part of the cross section taken along line A-A' of FIG. 2. In these drawings, the x axis, the y axis and the z axis, which are perpendicular to one another, are shown. The directions indicated by the x axis, the y axis and the z axis shown in the drawings of the present disclosure are common among all of the drawings.

The light-emitting unit 200 includes a wiring board and a light source portion 100 mounted onto the wiring board 10. In the configurations illustrated in FIG. 1, the light source portion 100 includes a plurality of light-emitting elements 20, a light reflecting member 30, a light diffusing layer 40, a wavelength conversion layer 50, and a plurality of light reflecting layers 60. The total thickness (i.e., the height in the z direction) of the light-emitting unit 200 is, for example, about 0.60 mm. As illustrated in FIG. 2, a typical example of the shape of the light source portion 100 is a rectangular shape in a top view. The length in the x direction, $Lx_1$, and the length in the y direction, $Ly_1$, of the light source portion 100 are, for example, about 52.0 mm.

The plurality of light-emitting elements 20 can be arrayed one-dimensionally or two-dimensionally over the upper surface 10a of the wiring board 10. In the present embodiment, the plurality of light-emitting elements 20 are arrayed two-dimensionally along two directions which are perpendicular to each other (herein, the x direction and the y direction). In the example shown in FIG. 2, 26 light-emitting elements 20 are arrayed along the x direction, and 26 light-emitting elements 20 are arrayed along the y direction. That is, the light source portion 100 includes 676 light-emitting elements 20. In this example, the arrangement pitch px in the x direction and the arrangement pitch py in the y direction are equal. Herein, the arrangement pitch of the light-emitting elements means the distance between the optical axes L of two adjoining light-emitting elements which are perpendicular to the emission surfaces (see FIG. 1). Each of the arrangement pitches px, py can be not less than 0.5 mm and not more than 10.0 mm. In the present embodiment, each of the arrangement pitches px and py can be about 2.0 mm.

As schematically shown in FIG. 1, the plurality of light-emitting elements 20 are provided in the light source portion 100. In the configuration illustrated in FIG. 2, the light source portion 100 includes 676 regions each of which includes a single light-emitting element 20. In the following sections, for the sake of convenience in description, the section which includes a single light-emitting element is also referred to as "segment" or "individual region". Hereinafter, respective components will be described in detail.

Wiring Board 10

The wiring board 10 has the upper surface 10a and a lower surface 10b. On the upper surface 10a side of the wiring board 10, the plurality of light-emitting elements 20 are provided and supported. The wiring board 10 includes an insulating layer 11 and a plurality of conductor wire layers (or metal layers) each of which has a wiring pattern. In the present embodiment, the wiring board 10 has a multilayer structure including a first conductor wire layer 12a and a second conductor wire layer 12b. The first conductor wire layer 12a and the second conductor wire layer 12b are electrically connected together through a via 13 provided in the insulating layer 11. Part of the insulating layer 11 covers the upper surface 10a of the wiring board 10 exclusive of a region to which the light-emitting element 20 is mounted. The wiring patterns of the conductor wire layers will be described later in detail.

A typical example of the wiring board 10 is a flexible printed circuit (FPC) which can be manufactured by a roll-to-roll method. In the present embodiment, an FPC is described as an example of the wiring board 10 to which the light source portion 100 is mounted. The FPC includes a film-shaped insulator (e.g., resin film) and a conductor wire layer which is formed of, for example, copper. Examples of the resin material that forms the insulator of the FPC include phenolic resins, epoxy resins, polyimide resins, BT resins, polyphthalamide (PPA), and polyethylene terephthalate (PET). Using an FPC as the wiring board 10 can reduce the weight and thickness of the light-emitting unit.

For example, the length in the x direction of the wiring board 10, $Lx_2$, is about 55.0 mm and the length in the y direction, $Ly_2$, is about 60.0 mm. The thickness of the wiring board 10 (i.e., the height in the z direction in the drawings) can be about 0.170 mm.

From the viewpoint of good in thermal resistance and light resistance, a ceramic material may be selected as the material of the wiring board 10. In such a case, the wiring board 10 is a rigid substrate. The rigid substrate can be a substrate which is thin enough to be flexible. Examples of the ceramic material include alumina, mullite, forsterite, glass ceramic materials, nitrides (e.g., AlN), and carbides (e.g., SiC).

The insulator of the wiring board 10 can be formed of a composite material such as a fiberglass-reinforced plastic (e.g., glass epoxy resin). That is, an inorganic filler, such as glass fiber, $SiO_2$, $TiO_2$, $Al_2O_3$, or the like, can be mixed in the above-described resin material. This may improve the mechanical strength of the wiring board 10. Also, the coefficient of thermal expansion may be reduced, and the reflectance may be improved.

In the configuration illustrated in FIG. 1, the first conductor wire layer 12a is provided on the upper surface 10a side of the wiring board 10. Each of the plurality of light-emitting elements 20 has an anode 21a and a cathode 21c which are electrically connected with the first conductor wire layer 12a. On the other hand, the second conductor wire layer 12b is provided on the lower surface 10b side of the wiring board 10. The second conductor wire layer 12b has a wiring pattern for supplying electric power from an external control circuit (not shown) to the plurality of light-emitting elements 20 via a connector C of the wiring board 10 (see FIG. 2). The material of the conductor wire layers can be appropriately selected according to the material used for the insulator of the wiring board 10, the manufacturing method, etc. For example, in the case in which the material of the insulator of the wiring board 10 is an epoxy resin, the material of the conductor wire layers is preferably a material which can be easily processed. For example, the conductor wire layers of the wiring board 10 can be realized by forming a metal layer of copper, nickel, or the like, by plating, sputtering, deposition, or pressure bonding and processing the metal layer by photolithographically or the like into a predetermined wiring pattern. Alternatively, the conductor wire layers can be realized by printing. By coating the wiring pattern with a solder resist, oxidation of the surface of the wiring pattern can be suppressed.

In the case in which the material of the insulator of the wiring board 10 is a ceramic material, a refractory metal which can be sintered simultaneously with the ceramic material can be employed as the material of the conductor wire layers. For example, the conductor wire layers can be formed of a refractory metal such as tungsten, molybdenum, or the like. The conductor wire layers can have a multilayer structure. For example, the conductor wire layers can include a pattern of a refractory metal, which is formed by the above-described method, and a metal layer of a different metal such as nickel, gold, silver, or the like, which is formed on the pattern by plating, sputtering, deposition, or the like.

An example of the wiring pattern which can be provided in the wiring board 10 is described in detail with reference to FIG. 3 and FIG. 4.

Figure 3:
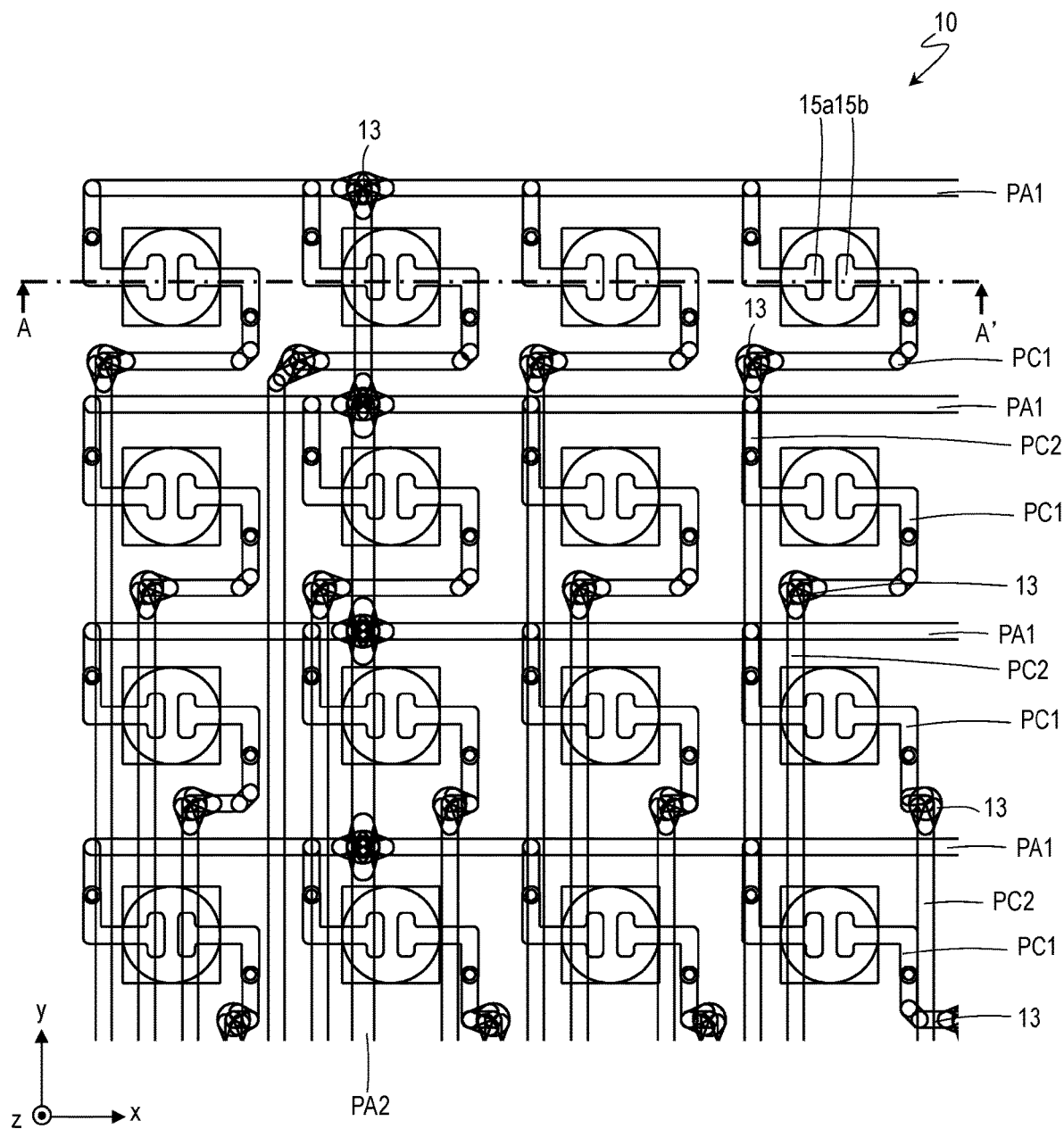
FIG. 3 is a diagram schematically and enlargedly showing a region including 4×4 segments enclosed by a broken-line rectangle shown in FIG. 2.

FIG. 3 enlargedly shows a region including 4×4 segments enclosed by a broken-line rectangle shown in FIG. 2 (hereinafter, also simply referred to as "segment region"). FIG. 4 shows a layout example of a wiring pattern in the segment region.

676 light-emitting elements 20 which are two-dimensionally arrayed are electrically connected with a wiring pattern provided in the first conductor wire layer 12a. The wiring pattern provided in the first conductor wire layer 12a is electrically connected with a wiring pattern provided in the second conductor wire layer 12b through the via 13. The wiring pattern provided in the second conductor wire layer 12b is electrically connected with the connector C. This electrical connection enables supply of electric power from an external control circuit (not shown) to the plurality of light-emitting elements 20 via the connector C of the wiring board 10.

Figure 4:
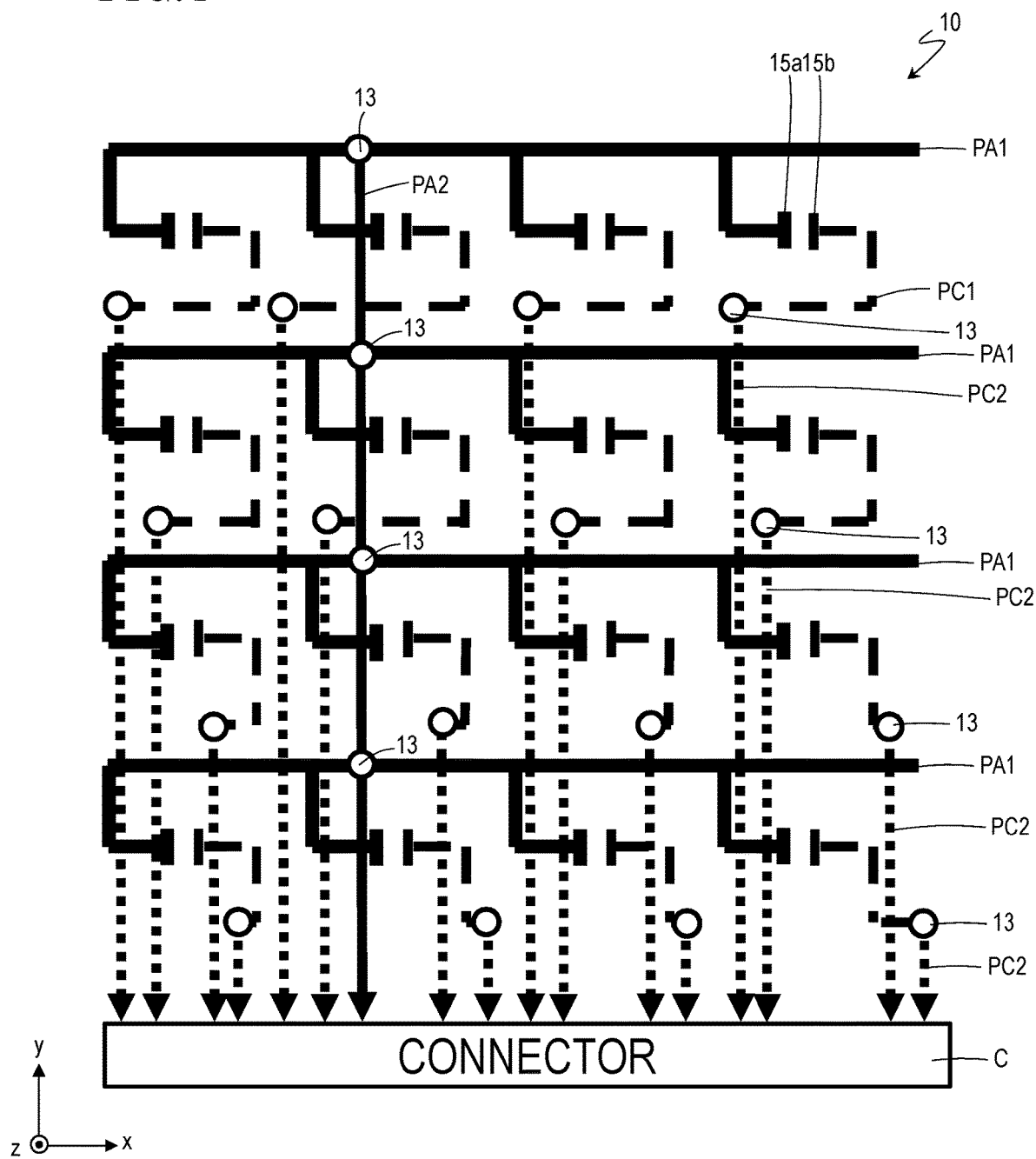
FIG. 4 is a diagram for illustrating a layout example of a wiring pattern in the segment region shown in FIG. 3.

FIG. 4 shows an example of the shape of an anodic land 15a and a cathodic land 15b, which are provided for mounting the anode 21a and the cathode 21c of the light-emitting element 20 of each segment to the wiring pattern provided in the first conductor wire layer 12a. In the example shown in FIG. 3 and FIG. 4, the first conductor wire layer 12a includes a plurality of wiring patterns PA1, each of which extends in the x direction. These wiring patterns PA1 are provided along the y direction of the segment array of 4 rows and 4 columns. Each of the wiring patterns PA1 connects among a plurality of lands 15a located in the same row. That is, each of the wiring patterns PA1 electrically connects together the anodes 21a of a plurality of light-emitting elements 20 located in the same row. A plurality of wiring patterns PA1 located in a plurality of rows are electrically connected with a common wiring pattern PA2 provided in the second conductor wire layer 12b through the via 13. The wiring pattern PA2 extends in the y direction and is connected with the connector C. This electrical connection enables supply of a common voltage driving signal from the wiring pattern PA2 to the anodes 21a of all of the light-emitting elements 20.

The first conductor wire layer 12a also includes a wiring pattern PC1 provided in each segment. The wiring pattern PC1 is connected with the cathodic land 15b and is electrically connected with a wiring pattern PC2 through the via 13. The wiring pattern PC2 is provided for each segment in the second conductor wire layer 12b and is connected with the connector C. This electrical connection enables supply of a voltage driving signal to the cathode 21c of each light-emitting element 20 via the wiring pattern PC2 on a segment-by-segment basis.

The above-described anodic and cathodic wiring patterns enable matrix driving of the light-emitting element in each segment. The light source portion 100 is capable of a local dimming operation.

Light-Emitting Elements 20

FIG. 1 is referred to again. As previously described, in the present embodiment, the plurality of light-emitting elements 20 are two-dimensionally arrayed along the x direction and the y direction, and the arrangement pitch px in the x direction and the arrangement pitch py in the y direction are equal. However, the arrangement of the plurality of light-emitting elements 20 is not limited to this example. The arrangement pitch of the light-emitting elements can be different between the x direction and the y direction. The two directions of the two-dimensional array of the plurality of light-emitting elements 20 may not be perpendicular to each other. The arrangement pitch is not limited to equal intervals but can be unequal intervals. For example, the plurality of light-emitting elements 20 can be arrayed such that the intervals increase from the center to the periphery of the wiring board 10.

The light-emitting elements 20 are semiconductor light-emitting elements. As the light-emitting elements 20, a known light-emitting element such as semiconductor laser, light-emitting diode, or the like, can be used. In the present embodiment, a light-emitting diode is illustrated as an example of the light-emitting elements 20. A wavelength of light emitted from the light-emitting elements 20 can be appropriately selected. For example, as a light-emitting element which is capable of emitting light with a wavelength from blue to green, a semiconductor light-emitting element can be used in which ZnSe, a nitride semiconductor ($In_xAl_yGa_{1-x-y}N$, $0 \leq X$, $0 \leq Y$, $X+Y \leq 1$), or GaP is used. As a light-emitting element which is capable of emitting light at a wavelength of red, a semiconductor light-emitting element can be used which includes a semiconductor such as GaAlAs, AlInGaP, or the like. Alternatively, a semiconductor light-emitting element which is made of a material other than those mentioned herein can also be used for the light-emitting elements 20. The composition of the semiconductor used and the emission color, size and number of the light-emitting elements can be appropriately selected according to purposes and design specifications.

The light-emitting elements 20 includes, for example, a light-transmitting substrate and a semiconductor multilayer structure formed on the substrate. The semiconductor multilayer structure includes an active layer, and an n-type semiconductor layer and a p-type semiconductor layer between which the active layer is interposed. The light-emitting elements 20 preferably includes a nitride semiconductor ($In_xAl_yGa_{1-x-y}N$, $0 \leq X$, $0 \leq Y$, $X+Y \leq 1$) which is capable of emitting light with a short wavelength. This enables efficient excitation of phosphors in a wavelength conversion layer 50 that will be described later. According to the material and/or the mixed crystal ratios of the semiconductor, the emission wavelength can be variously selected.

The cathode 21c and the anode 21a are electrically connected with the n-type semiconductor layer and the p-type semiconductor layer, respectively. The light-emitting element 20 has an upper surface (or emission surface) 20a from which light is emitted and a lower surface 20b which is opposite to the upper surface 20a. The light-emitting element 20 may have both the anode and the cathode on the same surface side or may have the anode and the cathode on different surfaces. In the present embodiment, both the anode 21a and the cathode 21c are located on the lower surface 20b side.

The anode 21a and the cathode 21c of the light-emitting element 20 are electrically connected with, and fixed to, the first conductor wire layer 12a provided at the upper surface 10a side of the wiring board 10. In the present embodiment, an FPC can be used for the wiring board 10. The light-emitting element 20 can be mounted in the form of the light source portion 100 to the wiring board 10 or can be directly mounted to the wiring board 10.

The light-emitting element 20 is typically a bare chip. The light-emitting element 20 can include a lens, or the like, for widening the emission angle of light emitted from the upper surface 20a. The height in the z direction from the upper surface 10a of the wiring board 10 to the upper surface 20a of the light-emitting element 20 can be, for example, about 0.425 mm.

The plurality of light-emitting elements 20 provided in the light-emitting unit 200 can include two or more types of light-emitting elements. The plurality of light-emitting elements 20 can include, for example, light-emitting elements which are capable of emitting light at a wavelength of blue, light-emitting elements which are capable of emitting light at a wavelength of green, and light-emitting elements which are capable of emitting light at a wavelength of red. The type of the light-emitting elements used in the light-emitting unit 200 may be determined from the viewpoint of improving the color rendering properties of light emitted from the light-emitting unit 200.

Light Reflecting Member 30

The light reflecting member 30 is provided on the wiring board 10 and covers the upper surface 10a of the wiring board 10 and the lateral surfaces 20c of each of the plurality of light-emitting elements 20. The light reflecting member 30 can be formed so as to cover the anode 21a and the cathode 21c and to at least partially fill the gap between the lower surface 20b of the light-emitting elements 20 and the upper surface 10a of the wiring board 10. However, the gap can be filled with an underfill in place of the light reflecting member 30. Formation of the underfill allows to relieve the stress which can be caused by the difference in the coefficient of thermal expansion between the light-emitting elements 20 and the wiring board 10 and to improve the heat dissipation.

The light reflecting member 30 can be formed of a material which contains a resin and particles of a reflective material dispersed in the resin. Examples of the reflective material particles include particles of oxides, such as titanium oxide, aluminum oxide, silicon oxide, and zinc oxide. The average particle size of the oxide particles is, for example, approximately, not less than 0.05 μm and not more than 30 μm. The light reflecting member 30 can further contain a pigment, a light absorber, a phosphor, etc. For the resin material which is for formation of the light reflecting member 30, a photocurable resin whose primary component is an acrylate resin, an epoxy resin, or the like, may be used. The reflective material particles which can scatter light may be uniformly distributed in the light reflecting member 30.

The upper surface 30a of the light reflecting member 30 has a recess 31 which includes at least one concave surface 31a. As shown in FIG. 1, there is a space between the concave surface 31a and the light diffusing layer 40. In other words, the recess 31 of the light reflecting member 30 forms a space between the concave surface 31a and the light diffusing layer 40. As a result, the light-emitting unit 200 has a space between the concave surface 31a and the light diffusing layer 40.

The inside of this space is filled with, for example, air. The shape of the recess 31 can be defined by a sink mark (or shrinkage cavity) which can occur after the resin material is cured in production of the light reflecting member 30. Typically, the recess 31 has such a shape that, in a top view, as the distance from the light-emitting element 20 increases, the distance between the concave surface 31a and the light diffusing layer 40 increases. In other words, the depth of the recess 31 (the distance between the concave surface 31a and the light diffusing layer 40 along the z direction) can increase as the distance from the light-emitting element 20 increases when viewed in plan. The maximum depth of the recess 31 can be, for example, about 30 μm. The shape of the recess(es), specifically the curvature of the concave surfaces of sink marks, can be controlled by adjusting the density of the reflective material contained in the resin. Theoretically, precisely controlling the shape of a plurality of concave surfaces is also possible.

The recess 31 can have a structure which has a plurality of continuously-formed concave surfaces 31a. For example, in a top view, the upper surface 30a of the light reflecting member 30 can have a recess 31, which has a plurality of continuously-formed concave surfaces 31a, in a region between the plurality of light-emitting elements 20. More specifically, the recess 31 can be configured as part of groove extending in the x direction and as part of groove extending in the y direction. In a top view, each of the plurality of grooves extending in the x direction is located between the upper surfaces 20a of two light-emitting elements 20 adjoining each other in the y direction, and each of the plurality of grooves extending in the y direction is located between the upper surfaces 20a of two light-emitting elements 20 adjoining each other in the x direction. The plurality of grooves extending in the x direction and the plurality of grooves extending in the y direction can intersect one another. In the upper surface 30a of the light reflecting member 30 exclusive of the regions of the plurality of upper surfaces 20a of the plurality of light-emitting elements 20, the plurality of grooves extending in the x direction and the plurality of grooves extending in the y direction can be provided. These grooves intersect one another, so that recess(es) 31 can be provided in the upper surface 30a in a lattice arrangement.

The light reflecting member 30 has the function of protecting the plurality of light-emitting elements 20. Also, the light reflecting member 30 has the function of reflecting light emitted from the light-emitting elements 20, particularly from the lateral surfaces 20c, and guiding the light to a region lying above the light-emitting elements 20. As a result, the utilization efficiency of light emitted from the light-emitting elements 20 can be improved. The light reflecting member 30 further has the function of reflecting part of the light emitted from the light-emitting elements 20 which is diffused by the light diffusing layer 40 so as to enter the light source portion 100 from various directions toward the side opposite to the wiring board 10 with respect to the light source portion 100. Particularly, since the upper surface 30a has the recess 31, the number of reflections of light between the concave surface 31a and the light diffusing layer 40 can increase and, therefore, the light extraction efficiency can be further improved. Due to the light reflecting member 30 which is also provided on the lower surface 20b side of the light-emitting elements 20, light traveling toward the upper surface 10a of the wiring board 10 can be reflected by the light reflecting member 30 and guided to a region lying above the light-emitting elements 20. As a result, the utilization efficiency of light emitted from the light-emitting elements 20 can be improved.

Light Diffusing Layer 40

The light diffusing layer 40 is located on or above the plurality of light-emitting elements 20 and the light reflecting member 30 and has the function of diffusing and guiding light emitted from the light-emitting elements 20. In the configuration illustrated in FIG. 1, the light diffusing layer 40 is a sheet-like member covering the plurality of light-emitting elements 20 and the light reflecting member 30. The light diffusing layer 40 may be a single layer or may have a multilayer structure including a plurality of sheets as will be described later. The thickness of the light diffusing layer 40 can be, for example, about 200 µm.

The light diffusing layer 40 may be in contact with the light-emitting elements 20 and/or the light reflecting member 30 or may be provided in the light source portion 100 so as to be spaced away from the light-emitting elements 20 and the light reflecting member 30. In the example shown in FIG. 1, the lower surface 40b of the light diffusing layer 40 is in direct contact with the upper surface 20a of the light-emitting elements 20. Therefore, light can be efficiently introduced from the light-emitting elements 20 into the light diffusing layer 40 so that the light extraction efficiency can be improved. If the recess 31 formed in the upper surface 30a of the light reflecting member 30 has a concave surface 31a of such a shape that the distance from the light diffusing layer 40 increases as the distance from the light-emitting elements increases when viewed in plan, light can be efficiently guided to a position away from the light-emitting elements 20 in the plane of the light diffusing layer 40. In other words, on the upper surface 40a side of the light diffusing layer 40 (on the side opposite to the lower surface 40b), occurrence of an excessive difference in luminance between regions immediately above the light-emitting elements 20 and regions away from the light-emitting elements 20 can be suppressed, and the effect of reducing the luminance unevenness can be expected.

The light diffusing layer 40 is formed using, for example, a material whose base material has small absorbance for visible light, such as polycarbonate resins, polystyrene resins, acrylic resins, polyethylene resins, etc. The light diffusing layer 40 typically contains a light diffuser. As the light diffuser, particles of a high refractive index material such as silicon oxide, zirconium oxide, or titanium oxide (high refractive index microparticles) can be used. The surface of the light diffusing layer 40 may be generally flat or may have minute recessed or raised portions.

Wavelength Conversion Layer 50

The wavelength conversion layer 50 is located on or above the light diffusing layer 40 and is capable of absorbing at least part of light emitted from the light-emitting elements 20 and transmitted through the light diffusing layer 40 and emitting light at a wavelength different from that of the light emitted from the light-emitting elements 20. For example, the wavelength conversion layer 50 converts the wavelength of part of blue light from the light-emitting element 20 and emits yellow light. With such a configuration, blue light which has passed through the wavelength conversion layer 50 and yellow light emitted from the wavelength conversion layer 50 are mixed together, resulting in white light. The thickness of the wavelength conversion layer 50 can be in the range of, for example, not less than 100 µm and not more than 200 µm. In the present embodiment, the thickness of the wavelength conversion layer 50 can be, for example, about 100 µm.

The wavelength conversion layer 50 is typically made of a material prepared by dispersing phosphor particles into a resin. Examples of the base material in which particles of a phosphor or the like are to be dispersed include silicone resins, modified silicone resins, epoxy resins, modified epoxy resins, urea resins, phenolic resins, acrylic resins, urethane resins, and fluoric resins, and a resin containing two or more of these resins. A material which has a different refractive index from that of the base material may be dispersed in the material of the wavelength conversion layer 50 such that the wavelength conversion layer 50 can have a light diffusion function. For example, particles of titanium oxide, aluminum oxide, silicon oxide, zinc oxide, or the like, may be dispersed in the base material of the wavelength conversion layer 50.

The phosphor can be a known material. Examples of the phosphor include fluoride-based phosphors such as KSF-based phosphors, nitride-based phosphors such as CASN, YAG-based phosphors, and β-SiAlON phosphors. The YAG-based phosphors are examples of a phosphor which is capable of converting blue light to yellow light. The KSF-based phosphors and CASN are examples of a phosphor which is capable of converting blue light to red light. The β-SiAlON phosphors are examples of a phosphor which is capable of converting blue light to green light. The phosphor may be a quantum dot phosphor.

The wavelength conversion layer 50 can contain a plurality of types of phosphors, for example, a phosphor which is capable of converting blue light to red light and a phosphor which is capable of converting blue light to green light. In such a case, the light-emitting unit 200 may allow blue light emitted from the light-emitting element 20 to enter the wavelength conversion layer 50 such that red light, blue light and green light are mixed together, and the light-emitting unit 200 emits white light.

According to the above-described multilayer structure of the light diffusing layer 40 and the wavelength conversion layer 50, the light emitted from the light-emitting elements 20 can be first diffused inside the light diffusing layer 40 before it enters the wavelength conversion layer 50. This can advantageously reduce the luminance unevenness and achieve more uniform luminance.

The light-emitting unit 200 consists of a plurality of members of different materials. Therefore, there is a probability that stress will occur due to the difference in coefficient of thermal expansion among the members, and warpage will occur in the light-emitting unit 200. Generally, a member which is primarily made of a resin material is more likely to thermally expand than an FPC. For example, during the operation of the light-emitting unit 200, the light-emitting elements 20 produce heat and accordingly the internal temperature increases, and in some cases, warpage can occur in the light-emitting unit 200 due to the difference in coefficient of thermal expansion between the wiring board 10 and the other members (e.g., the light reflecting member 30, the light diffusing layer 40, and the like). The light reflecting member 30 can have a greater coefficient of thermal expansion than the wiring board 10. The light diffusing layer 40 can have a greater coefficient of thermal expansion than the light reflecting member 30. For example, the coefficient of thermal expansion of the wiring board 10 is about 20 ppm/° C., the coefficient of thermal expansion of the light reflecting member 30 is about 100 ppm/° C., and the coefficient of thermal expansion of the light diffusing layer 40 is about 200 ppm/° C. Therefore, there is a probability that, due to the heat produced by the light-emitting elements 20, the light-emitting unit 200 will warp toward the light diffusing layer 40 that has a large coefficient of thermal expansion (the central part of the light-emitting unit 200 will warp so as to form a convex in +z direction in the drawings).

The light-emitting unit 200 of the present embodiment has recesses 31 in the upper surface 30a of the light reflecting member 30. According to a configuration which has the recesses 31 in the upper surface 30a of the light reflecting member 30, the recess 31 is recessed in a direction opposite to the warpage of the light-emitting unit 200 (i.e., −z direction in the drawings). Therefore, even if a member which is primarily made of a resin, such as the light reflecting member 30 and the light diffusing layer 40, expands, the degree of the warpage is advantageously moderated. Thus, according to an embodiment of the present disclosure, the degree of the warpage which can occur due to the difference in coefficient of thermal expansion between the light reflecting member 30 or the light diffusing layer 40 and the wiring board 10 can be moderated.

Light Reflecting Layer 60

As shown in FIG. 1, a plurality of light reflecting layers 60 are respectively provided between the light diffusing layer 40 and the wavelength conversion layer 50. In this example, each of the plurality of light reflecting layers 60 is provided on the upper surface 40a of the light diffusing layer 40. Each of the light reflecting layers 60 is located above a corresponding one of the plurality of light-emitting elements 20.

In this example, in the upper surface 40a of the light diffusing layer 40, a light reflecting layer 60 is selectively provided above the emission surface 20a of each of the light-emitting elements 20 so that a space 55 is formed between the light diffusing layer 40 and the wavelength conversion layer 50. In other words, an air layer which has a thickness defined by the thickness of the plurality of light reflecting layers 60 can be formed between the light diffusing layer 40 and the wavelength conversion layer 50. When the wavelength conversion layer 50 is provided above the light diffusing layer 40 by an adhesive agent applied onto the light diffusing layer 40, the space 55 can be filled with the adhesive agent.

Each of the light reflecting layers 60 is a semi-light-shielding layer which is capable of transmitting part of incoming light and reflecting other part of the incoming light. The thickness of the light reflecting layers 60 can be in the range of, for example, not less than 50 µm and not more than 100 µm. In the present embodiment, the thickness of the light reflecting layers 60 can be, for example, about 50 µm. As the materials of the light reflecting member 30, the light reflecting layers 60 can be formed of a material which contains a resin and oxide particles of titanium oxide, aluminum oxide, silicon oxide, or the like, which are the reflective material particles dispersed in the resin, as is the light reflecting member 30. The average particle size of the oxide particles is, for example, about not less than 0.05 µm and not more than 30 µm. The light reflecting layers 60 can further contain a pigment, a light absorbing material, a phosphor, etc. For the resin material for being formed of the light reflecting layers 60, a photocurable resin whose primary component is an acrylate resin, an epoxy resin, or the like, can be used.

The light reflecting layer 60 is selectively provided above the emission surface 20a of each of the light-emitting elements 20 between the light diffusing layer 40 and the wavelength conversion layer 50. In a top view, the region of each of the plurality of light reflecting layers 60 includes the emission surface 20a of a corresponding one of the plurality of light-emitting elements 20. That is, the area of the region of each of the light reflecting layers 60 is equal to or greater than the area of the emission surface 20a. Due to this, part of light traveling to a region lying above the light-emitting element 20 is reflected by the light reflecting layer 60 and, as a result, the luminance immediately above the light-emitting element 20 is suppressed. The center of the region of each of the light reflecting layers 60 is preferably on the optical axis L extending in a direction perpendicular to the emission surface 20a of a corresponding light-emitting element 20.

The emission surface 20a of the light-emitting elements 20 typically has a rectangular shape and, accordingly, in a top view, the region of each of the light reflecting layers 60 typically has a rectangular shape. For example, the region of the light reflecting layer 60 can be square, and the length of one side of the square region can be about 0.5 mm. In a top view, the light reflecting layer 60 may be provided on the light diffusing layer 40 such that one side of the rectangular shape of the light reflecting layer 60 is parallel to or perpendicular to one side of the rectangular shape of the light-emitting element 20. Alternatively, the light reflecting layer 60 may be provided on the light diffusing layer 40 such that one side of the rectangular shape of the light reflecting layer 60 is diagonal to one side of the rectangular shape of the light-emitting element 20. For example, the light reflecting layer 60 may be provided on the light diffusing layer 40 such that one side of the rectangular shape of the light reflecting layers 60 is parallel to a diagonal of the rectangular shape (e.g., square) of the emission surface 20a. In the embodiment of the present disclosure, it is not essential that the region of each of the light reflecting layers 60 has a rectangular shape in a top view. The region of each of the light reflecting layers 60 may have a circular shape when viewed in plan.

Due to the light reflecting layer 60 that is provided immediately above the light-emitting element 20, at least part of light emitted from the light-emitting element 20 in a direction parallel to the optical axis L is blocked and effectively diffused in the plane of the light diffusing layer 40. As a result, the luminance can be improved exclusive of the region immediately above the light-emitting element 20. In other words, the unevenness in luminance at the upper surface of the light-emitting unit 200 is effectively suppressed, and more uniform light can be achieved.

In the present embodiment, the distance from the emission surface 20a of the light-emitting element 20 to the light reflecting layer 60 is about 200 µm, i.e., very short. Thus, by arranging the region of the light reflecting layer 60 so as to be perfectly coincident with the emission surface 20a when viewed in plan, the luminance in a region immediately above the light-emitting element 20 can be suppressed, and the luminance can be improved exclusive of the region immediately above the light-emitting element 20, while the area of the light reflecting layer 60 is the minimum. When the region of the light reflecting layer 60 is circular and the emission surface 20a of the light-emitting element 20 has a square shape, the diameter of the region of the light reflecting layer 60 may be identical with the length of a diagonal of the square shape of the emission surface 20a.

Each of the plurality of light reflecting layers 60 can have a dotted reflection pattern in a top view. That is, each of the light reflecting layers 60 may be an aggregate of a plurality of light reflecting members each having the shape of a dot. In such a case, the dot density of the reflection pattern in the light reflecting layer 60 can increase from the periphery to the center of the region of the light reflecting layer 60. As an example, the dotted reflection pattern can be a pattern defined by the distribution of reflective material particles which scatter light in the light reflecting layer 60. The density of the distributed reflective material particles is higher in a region where the absolute value of the light distribution angle of the light-emitting element 20 is small (i.e., the angular range where the inclination from the optical axis L is small) than in a region where the absolute value of the light distribution angle is large. In this way, the light transmittance can be changed according to the absolute value of the light distribution angle, and the reflectance and/or transmittance of light can be controlled according to the density of dots. In another example, by controlling the thickness of the light reflecting layer 60, the light transmittance can be changed according to the absolute value of the light distribution angle. As the absolute value of the light distribution angle of the light-emitting element 20 decreases, i.e., as the position approaches from the periphery of the region of the light reflecting layer 60 to the optical axis, the thickness of the light reflecting layer 60 can be gradually increased.

Figure 5:
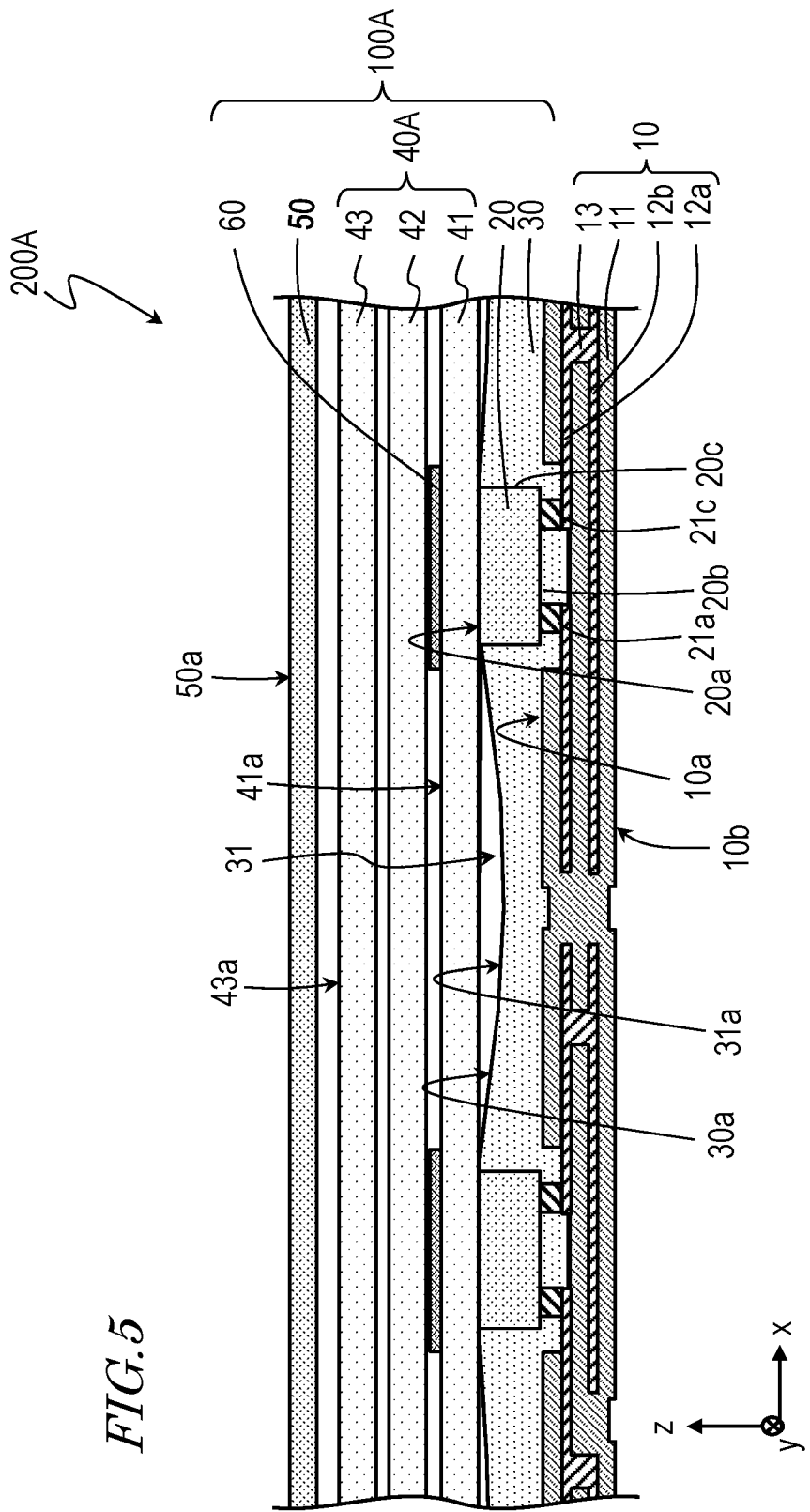
FIG. 5 is a cross-sectional view schematically showing an exemplary configuration of a light-emitting unit 200A of another embodiment of the present disclosure.

FIG. 5 is a cross-sectional view schematically showing an exemplary configuration of a light-emitting unit 200A of another embodiment of the present disclosure. The light-emitting unit 200A shown in FIG. 5 is different from the light-emitting unit 200 shown in FIG. 1 in that the light-emitting unit 200A includes a light source portion 100A in place of the light source portion 100. A difference between the light source portion 100 and the light source portion 100A resides in that the light source portion 100A includes a light diffusing layer 40A of a multilayer structure in place of the light diffusing layer 40.

In the configuration illustrated in FIG. 5, the light diffusing layer 40A includes the first light diffusing layer 41, the second light diffusing layer 42 and the third light diffusing layer 43. As shown in FIG. 5, the first light diffusing layer 41, the second light diffusing layer 42 and the third light diffusing layer 43 are arranged in the light source portion 100A in this order from the wiring board 10 toward the wavelength conversion layer 50. In other words, the second light diffusing layer 42 is located between the first light diffusing layer 41 and the third light diffusing layer 43, and the first light diffusing layer 41 is located between the light reflecting member 30 and the second light diffusing layer 42.

The light-emitting unit 200A is the same as the above-described light-emitting unit 200 in that the plurality of light reflecting layers 60 are provided in the light source portion 100A so as to cover the upper surface 20a of corresponding light-emitting elements 20 when viewed in plan. In the example shown in FIG. 5, the plurality of light reflecting layers 60 are provided on the upper surface 41a of the first light diffusing layer 41 that is closest to the light reflecting member 30 among the first light diffusing layer 41, the second light diffusing layer 42 and the third light diffusing layer 43. In other words, in this example, the plurality of light reflecting layers 60 are located between the first light diffusing layer 41 and the second light diffusing layer 42. The space between the first light diffusing layer 41 and the second light diffusing layer 42 may be filled with air or may be filled with any other material such as adhesive agent. The space between the second light diffusing layer 42 and the third light diffusing layer 43 and the space between the third light diffusing layer 43 and the wavelength conversion layer 50 may allow an air layer to intervene or may be filled with an adhesive agent or the like.

In the light diffusing layer 40A which has a multilayer structure consisting of a plurality of sheets as in this example, arrangement of the plurality of light reflecting layers 60 is not limited to locations on the upper surface 41a of the first light diffusing layer 41 that is closest to the light reflecting member 30. The plurality of light reflecting layers 60 may be provided, for example, between the second light diffusing layer 42 and the third light diffusing layer 43, on the upper surface 43a of the third light diffusing layer 43, or on the lower surface of the first light diffusing layer 41 which is opposite to the upper surface 41a. Note that, however, according to research by the present inventors, when the light diffusing layer lying above the light reflecting member 30 includes a plurality of sheets, providing the plurality of light reflecting layers 60 on one of these sheets which is closest to the light reflecting member 30 (in this example, the first light diffusing layer 41) is advantageous from the viewpoint of reducing the luminance unevenness.

Figure 6:
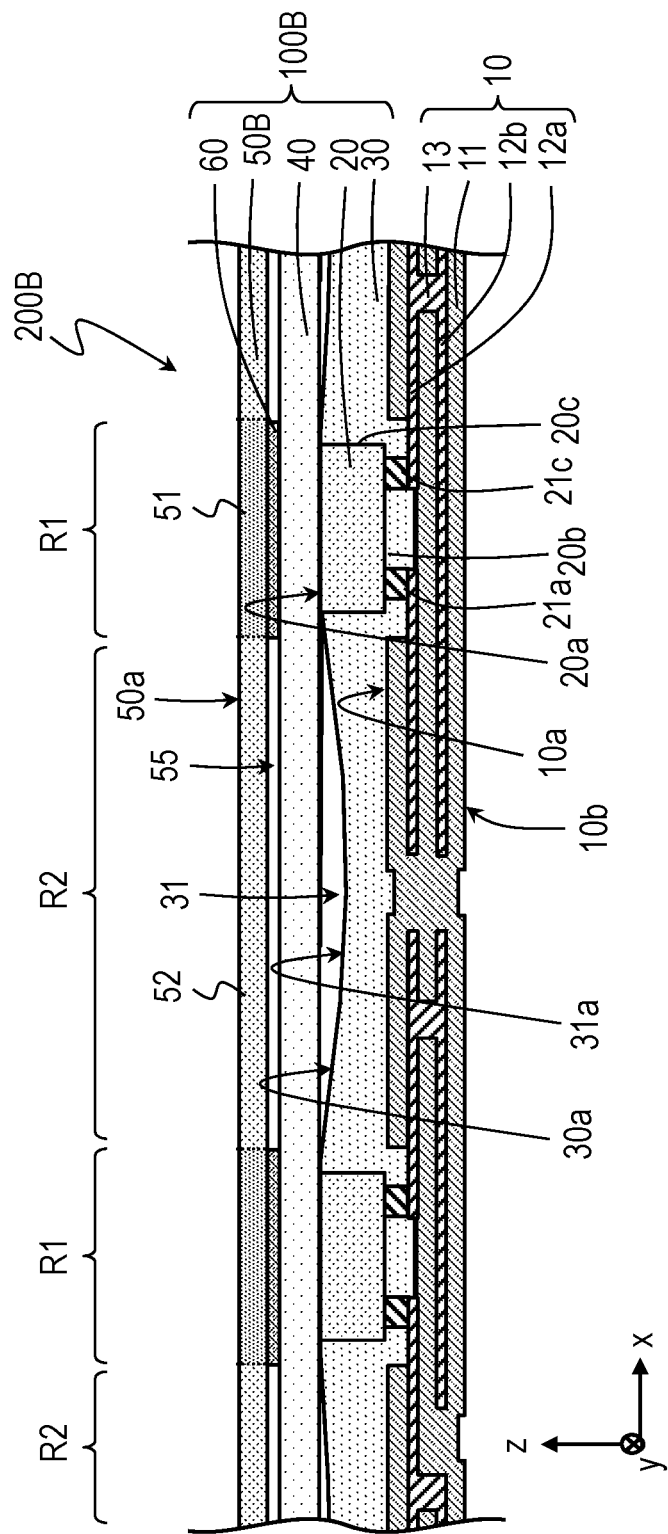
FIG. 6 is a cross-sectional view schematically showing an exemplary configuration of a light-emitting unit 200B of still another embodiment of the present disclosure.

FIG. 6 is a cross-sectional view schematically showing an exemplary configuration of a light-emitting unit 200B of still another embodiment of the present disclosure. The light-emitting unit 200B shown in FIG. 6 is different from the light-emitting unit 200 shown in FIG. 1 in that the light-emitting unit 200B includes a light source portion 100B in place of the light source portion 100. The light source portion 100B includes, in part, a wavelength conversion layer 50B.

In the configuration illustrated in FIG. 6, the wavelength conversion layer 50B includes a plurality of first regions R1. The plurality of first regions R1 are provided in the wavelength conversion layer 50B so as to correspond to the plurality of light-emitting elements 20. Each of the first regions R1 is located above a corresponding one of the plurality of light-emitting elements 20. Also, the wavelength conversion layer 50B includes a second region R2 which is arranged so as to surround the plurality of first regions R1 when viewed in plan.

Both the first regions R1 and the second region R2 are regions in which phosphor particles are dispersed. Note that, however, in this example, the density of the phosphor in the first regions R1 and the density of the phosphor in the second region R2 are different from each other. Herein, the density of the phosphor in the first regions R1 is higher than in the second region R2. More specifically, in the example shown in FIG. 6, the wavelength conversion layer 50B includes a plurality of first portions 51 located in the plurality of first regions R1 and a second portion 52 located in the second region R2. The density of the phosphor in each of the plurality of first portions 51 is higher than the density of the phosphor in the second portion 52.

Generally, in a semiconductor light-emitting element, the intensity of light emitted in an angle range which is close to the optical axis is large as compared with a range in which the absolute value of the angle from the optical axis is large. Thus, in a configuration where for example a phosphor layer is provided above a semiconductor light-emitting element which is capable of emitting blue light, a region immediately above the light-emitting element is likely to appear more bluish as compared with a region away from the light-emitting element. This is because, in our estimation, in an angle range which is close to the optical axis, the distance traveled by light inside the phosphor layer is small as compared with a range in which the absolute value of the angle from the optical axis is large. As in the example shown in FIG. 6, the density of the phosphor in regions of the wavelength conversion layer 50B immediately above the light-emitting elements 20 (first regions R1) is selectively increased, whereby the proportion of light subjected to wavelength conversion can be increased. Thus, the effect of reducing the color unevenness over the emission surface can be expected.

The wavelength conversion layer 50B is formed, for example, as follows. First, a resin sheet containing a phosphor is provided, and thereafter, parts of the sheet corresponding to the first regions R1 are removed by punching or the like, whereby a plurality of through holes are formed in the resin sheet. Thereafter, the inside of the through holes is filled with a resin material which has a higher phosphor density, and the resin material inside the through holes is cured, whereby the plurality of first portions 51 can be formed at the positions of the through holes. In this way, the wavelength conversion layer 50B is realized which includes the plurality of first portions 51 of relatively-high phosphor density and the second portion 52 provided around the first portions 51. The planar shape of each of the plurality of first portions 51 may be congruent with or similar to the shape of the light reflecting layers 60 or may be different from the shape of the light reflecting layers 60.

Figure 7:
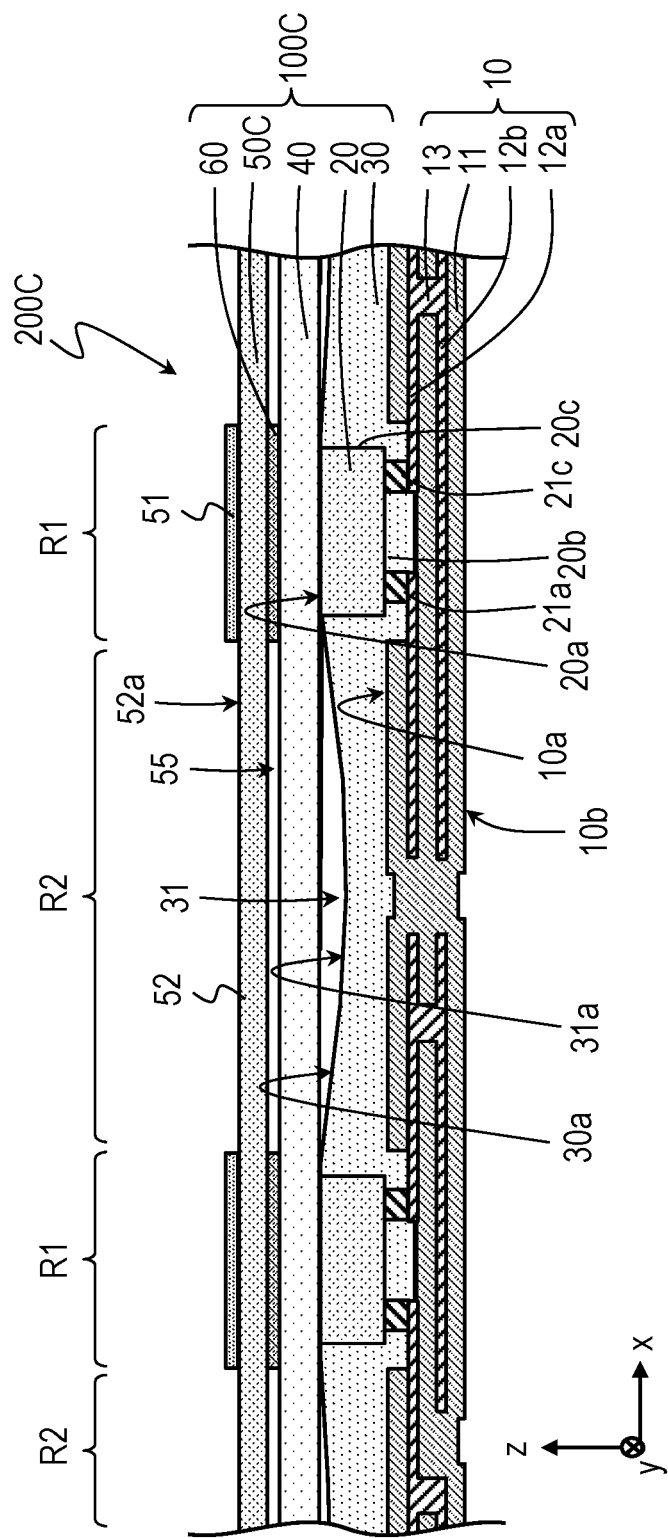
FIG. 7 is a cross-sectional view schematically showing an exemplary configuration of a light-emitting unit 200C of yet another embodiment of the present disclosure.

FIG. 7 is a cross-sectional view schematically showing an exemplary configuration of a light-emitting unit 200C of yet another embodiment of the present disclosure. As compared with the example previously described with reference to FIG. 6, the light source portion 100C of the light-emitting unit 200C includes a wavelength conversion layer 50C in place of the wavelength conversion layer 50B.

Likewise as in the example previously described with reference to FIG. 6, the wavelength conversion layer 50C includes a plurality of first portions 51 which are provided above the light-emitting elements 20 so as to correspond to the plurality of light-emitting elements 20 and a second portion 52 which has a relatively low phosphor density. Note that, however, as schematically shown in FIG. 7, in this example, the second portion 52 is provided in the light source portion 100C over the plurality of light-emitting elements 20, and the plurality of first portions 51 are provided on the upper surface 52a of the layered second portion 52. That is, in this example, the first regions R1 of relatively high phosphor density are provided in regions of the wavelength conversion layer 50C in which the first portions 51 and the second portion 52 overlap when viewed in plan. Or, it can be said that the wavelength conversion layer 50C includes the first portions 51 which function as the second wavelength conversion layers provided on respective ones of the first regions R1. The density of the phosphor in the first portions 51 is higher than the density of the phosphor in the second portion 52 of the wavelength conversion layer 50C.

As shown in FIG. 7, by covering the plurality of light-emitting elements 20 with a layer which contains a phosphor and further providing a second layer which has relatively high phosphor density at a position immediately above the light-emitting element 20, a plurality of regions of different phosphor densities can also be formed in the wavelength conversion layer. In this way, the phosphor density in the first regions R1 immediately above the light-emitting elements 20 can be high as compared with the other regions of the wavelength conversion layer, so that occurrence of color unevenness over the emission surface can be suppressed.

In the example shown in FIG. 7, the layered second portion 52 and the plurality of first portions 51 on the second portion 52 have different phosphor densities. Note that, however, such a configuration is also possible where the phosphor density in each of the plurality of first portions 51 on the second portion 52 is equal to the phosphor density in the second portion 52. In the light-emitting unit 200D illustrated in FIG. 8, a light source portion 100D which includes a wavelength conversion layer 50D is provided on the wiring board 10 in place of the light source portion 100C.

Figure 8:
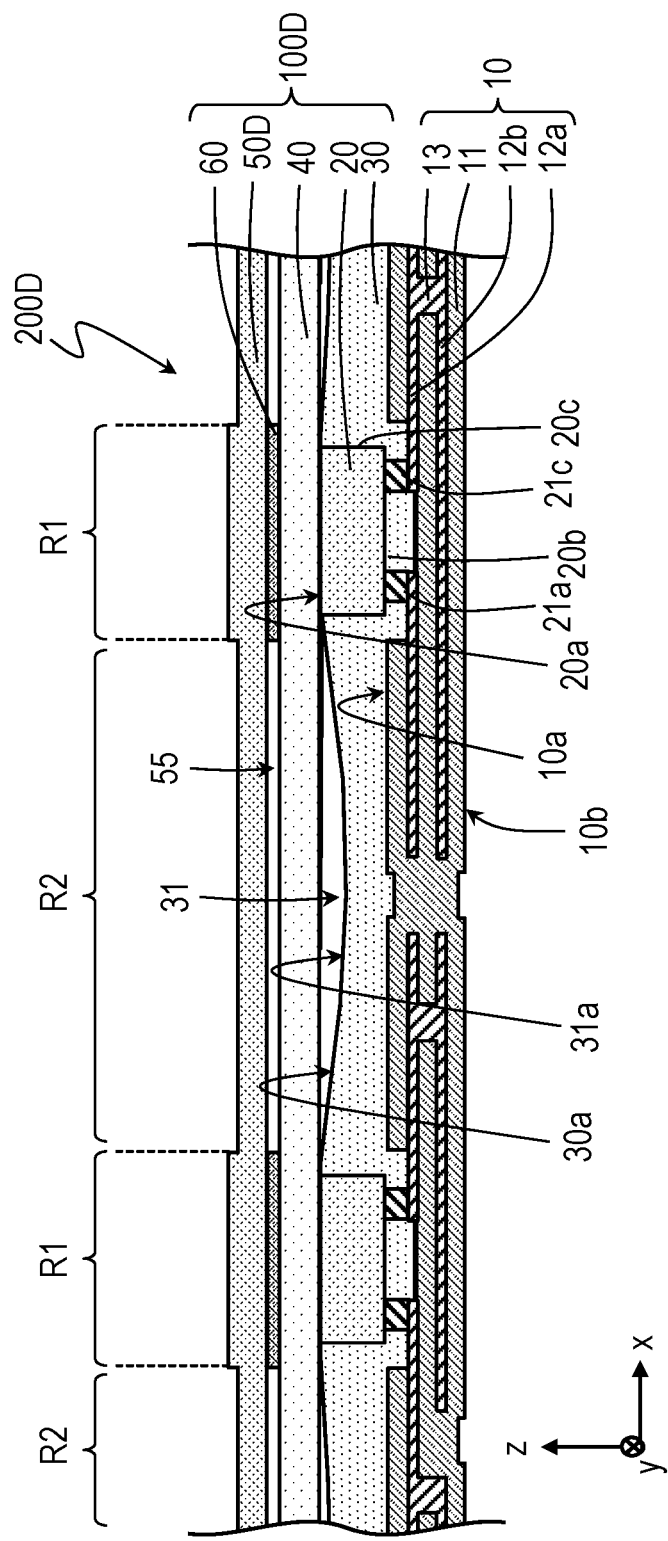
FIG. 8 is a cross-sectional view schematically showing an exemplary configuration of a light-emitting unit 200D of yet another embodiment of the present disclosure.

Likewise as in the examples shown in FIG. 6 and FIG. 7, the wavelength conversion layer 50D also includes a plurality of first regions R1 located above a plurality of light-emitting elements 20 and a second region R2 surrounding the first regions R1. As schematically shown in FIG. 8, the thickness of the wavelength conversion layer 50D is greater in the first regions R1 than in the second region R2. Thus, selectively increasing the thickness of the wavelength conversion layer 50D in regions immediately above the light-emitting elements 20 can also suppress occurrence of, for example, a bluish hue in regions of the emission surface immediately above the light-emitting elements 20.

The wavelength conversion layer 50D can be formed by, for example, applying a resin material which contains a phosphor to predetermined regions of a principal surface of a resin sheet in which a phosphor is dispersed and curing the applied resin material. In this case, the phosphor density may be varied between the material for formation of the resin sheet and the resin material applied onto the resin sheet, whereby the wavelength conversion layer 50C shown in FIG. 7 can be produced. According to such a production method, the wavelength conversion layer 50C also includes a plurality of parts which have different thicknesses. Note that the type of the phosphor may be varied among the plurality of first regions R1.

Figure 9:
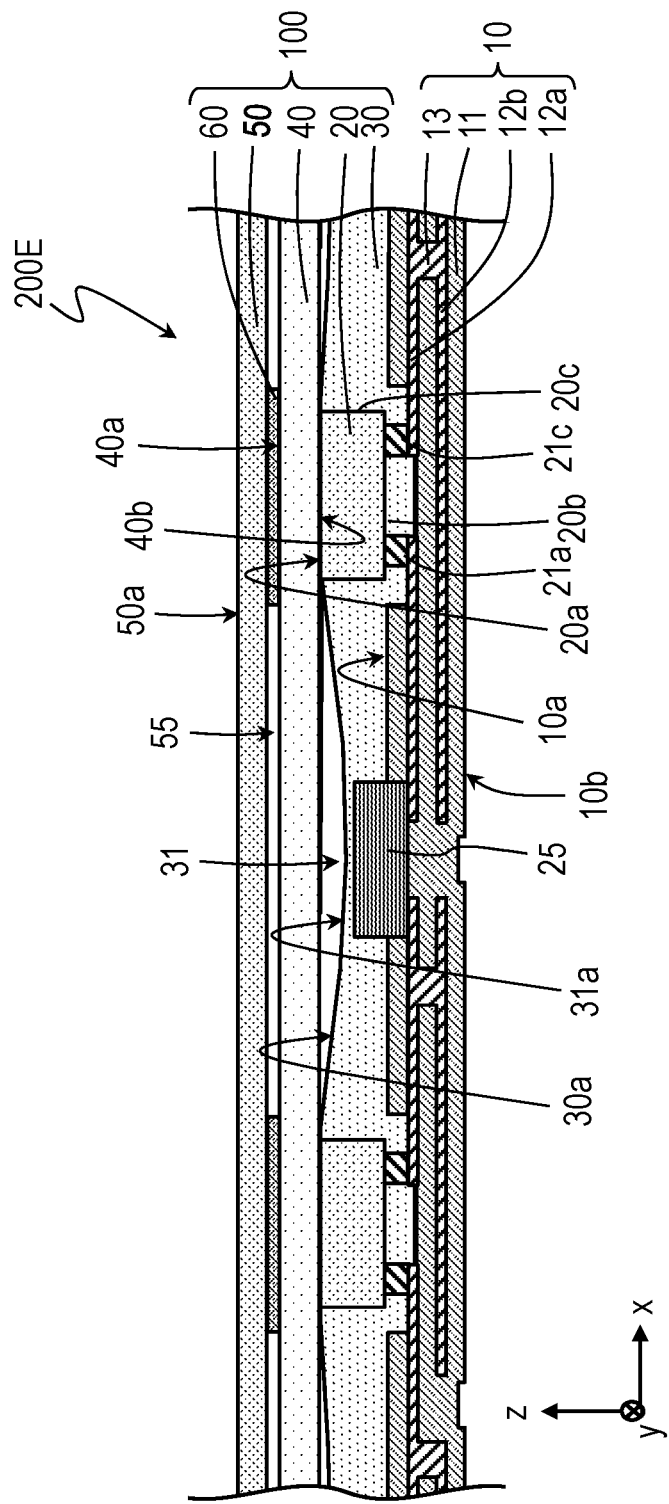
FIG. 9 is a cross-sectional view schematically showing an exemplary configuration of a light-emitting unit 200E of yet another embodiment of the present disclosure.

FIG. 9 is a cross-sectional view schematically showing an exemplary configuration of a light-emitting unit 200E of yet another embodiment of the present disclosure. The light-emitting unit 200E shown in FIG. 9 is different from the configuration previously described with reference to FIG. 1 in that the light-emitting unit 200E further includes a circuit element which is electrically coupled with the conductor wire layer of the wiring board 10 and which is different from the light-emitting elements 20. In this example, a circuit element 25 is mounted to the wiring board 10 together with the light-emitting elements 20, and the entirety of the circuit element 25 is covered with the light reflecting member 30. In other words, the entirety of the circuit element 25 is embedded in the light reflecting member 30.

The circuit element 25 can be, for example, a driver connected with two or more light-emitting elements 20 or a protection element such as zener diode or the like. When a protection element is provided as the circuit element 25 on the wiring board 10, the circuit element 25 can be electrically coupled in series or parallel with the light-emitting element 20 of each of the unit regions. In other words, the circuit element 25 can be mounted to the wiring board 10 in every one of the unit regions which includes the light-emitting element 20.

By mounting not only the light-emitting elements 20 but also the circuit elements 25 to the wiring board 10, an external control circuit connected with the connector C can be simplified. By burying the circuit elements 25 on the wiring board 10 into the light reflecting member 30 of the light source portion 100, absorption by the circuit elements 25 of light emitted from the light-emitting elements 20 can be avoided, and deterioration of the utilization efficiency of light which is attributed to the circuit elements 25 mounted to the wiring board 10 can be avoided.

Figure 10:
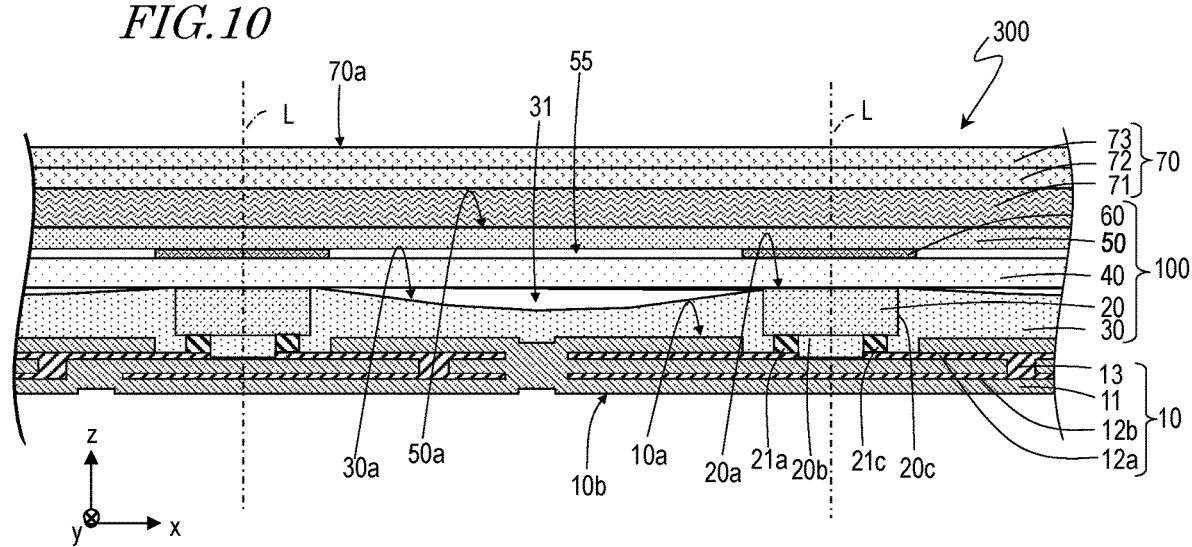
FIG. 10 is a cross-sectional view schematically showing an exemplary configuration of a surface-emission light source 300 of yet another embodiment of the present disclosure.

FIG. 10 is a cross-sectional view showing an exemplary configuration of a surface-emission light source 300 of yet another embodiment of the present disclosure. The surface-emission light source 300 includes any of the above-described light-emitting units 200, 200A, 200B, 200C, 200D and 200E and a light-transmitting multilayer structure 70. The light-transmitting multilayer structure 70 includes a diffuser and prism films 72 and 73. The shape of the light-transmitting multilayer structure 70 is, for example, a rectangular shape when viewed in plan. FIG. 10 illustrates a cross-sectional structure of the surface-emission light source 300 that is realized by providing the light-transmitting multilayer structure 70 on or above the light-emitting unit 200 that has the cross-sectional structure shown in FIG. 1.

Diffuser 71

In the surface-emission light source 300, the diffuser 71 can be provided on or above the wavelength conversion layer 50. In other words, the diffuser 71 can be provided in the surface-emission light source 300 so as to be spaced away from the upper surface 50a of the wavelength conversion layer 50 or can be in direct contact with at least part of the upper surface 50a. The diffuser 71 diffuses and transmits incoming light. The structure for diffusing light is provided in the diffuser 71 by providing recesses and protrusions in the surface of the diffuser 71 or dispersing a material having a different refractive index in the diffuser 71. The diffuser 71 is formed of, for example, a material whose absorbance with respect to visible light is small, such as polycarbonate resins, polystyrene resins, acrylic resins, polyethylene resins, etc. As the diffuser 71, an optical sheet commercially available under the name of "light diffusion sheet", "diffuser film", etc., may be used. The thickness of the diffuser 71 can be, for example, about 0.443 mm.

Prism Films 72, 73

Each of the prism films 72, 73 provided above the diffuser 71 includes an array of a plurality of prisms each extending in a predetermined direction. For example, in FIG. 10, the prism film 72 includes a plurality of prisms each extending in the y direction, and the prism film 73 includes a plurality of prisms each extending in the x direction. In the present disclosure, a multilayer structure of the prism films 72, 73 is referred to as "prism sheet". The prism films 72, refract light incoming from various directions in a direction toward a display panel (not shown) which is opposite to the light-emitting unit 200 (+z direction in the drawings). As a consequence, large part of the light outgoing from the upper surface 70a of the light-transmitting multilayer structure 70 which is the emission surface of the surface-emission light source 300 is perpendicular to the upper surface 70a (parallel to the z axis), so that the luminance of the surface-emission light source 300 as viewed from the front (z direction) can be improved. As the prism films 72, 73, a wide variety of commercially-available optical members for backlight can be used. The thicknesses of the prism films 72, can be, for example, about 0.07 mm and about 0.09 mm, respectively.

The light-transmitting multilayer structure 70 can include a prism sheet which has a multilayer structure of two prism films. The thickness of the prism sheet can be about 0.08 mm. Thus, the thickness of the prism sheet can be reduced to about a half of the thickness achieved in the case in which two prism films are simply stacked up. As the prism sheet, for example, Advanced Structured Optical Composite (ASOC) manufactured by 3M can be used. Using such a prism sheet can further reduce the thickness of the surface-emission light source 300. Such a thin surface-emission light source 300 is useful in uses for smartphones and the like. The prism sheet may be in direct contact with the diffuser 71 or can be provided in the light-transmitting multilayer structure 70 so as to be spaced away from the diffuser 71.

The surface-emission light source 300 can further include a reflective polarizing layer (not shown) located above the prism film 73. The reflective polarizing layer selectively transmits light advancing in a polarization direction which is identical with the polarization direction of a polarization plate located on the backlight side of a display panel, for example, a liquid crystal display panel, and reflects polarized light perpendicularly advancing in that polarization direction toward the prism film 72, 73 side. Part of the polarized light returning from the reflective polarizing layer is again reflected by the prism films 72, 73 and the diffuser 71 with the polarization direction being changed, and converted to polarized light advancing in polarization direction identical with that of the polarization plate of the liquid crystal display panel. The resultant light again enters the reflective polarizing layer and goes out to the display panel. In this way, light outgoing from the light-emitting unit 200 has an equal polarization direction, and light whose polarization direction is effective in improving the luminance of the display panel can be realized with high efficiency.

In recent years, the specification regarding the thickness of the light-emitting unit required in the market of video game consoles, smartphones, etc., is less than 2.0 mm. A very strict specification, for example, not less than 1.5 mm and not more than 1.65 mm, is sometimes required. The light-emitting unit 200 of an embodiment of the present disclosure can meet such a requirement. Further, the plurality of light reflecting layers 60 provided between the light diffusing layer 40 and the wavelength conversion layer 50 can appropriately inhibit the unevenness in luminance of the light emitted from the emission surface of the light-emitting unit 200.

Figure 11:
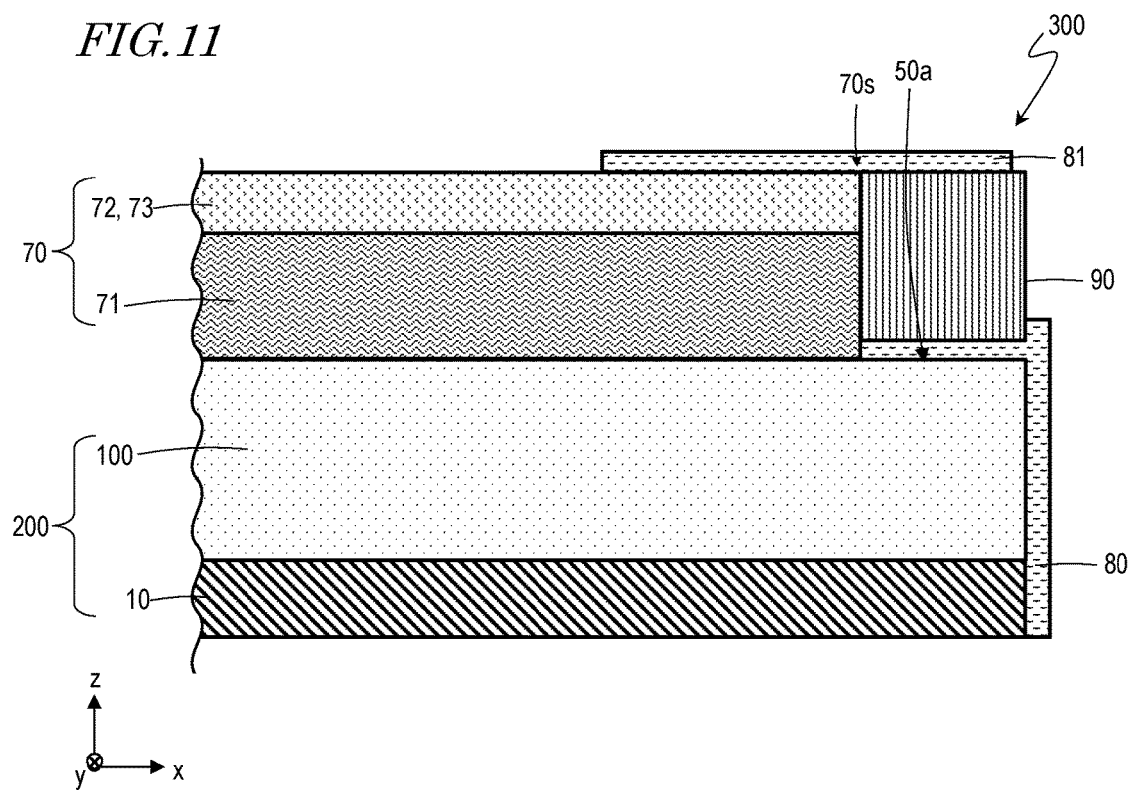
FIG. 11 is a cross-sectional view illustrating an edge portion of a light source portion 100 in the cross-sectional structure of the surface-emission light source 300 of the present embodiment.

FIG. 11 illustrates an edge portion of the light source portion 100 in the cross-sectional structure of the surface-emission light source 300 taken along line A-A' of FIG. 2. In the configuration illustrated in FIG. 11, the wiring board 10 and the light source portion 100 are fixed together by a tape 80 which covers the outer surfaces of these parts. Part of the tape 80 is in the form of a frame along the edges of the upper surface 50a of the wavelength conversion layer 50 of the light source portion 100. Part of the tape 80 overlying the upper surface 50a of the wavelength conversion layer 50 serves as an adhesive layer. By the adhesive layer, a rectangular frame 90 surrounding the outer surfaces of the light source portion 100 is fixed onto the light source portion 100. The light-transmitting multilayer structure 70, which includes the diffuser 71 and the prism films 72 and 73, is fixed onto the light source portion 100 by the frame 90. In this example, a frame-like tape 81 is provided on the upper surfaces of the frame 90 and the light-transmitting multilayer structure 70 along the border 70s between the frame 90 and the light-transmitting multilayer structure 70. As the tapes 80, 81, for example, a double-sided tape manufactured by Nitto Denko Corporation (model number: No. 5606BN) can be used.

According to such an assemblage, it is not necessary to secure a space for providing a frame at the outer edge of the FPC. Thus, the region in which the light source portion 100 is provided can be extended to the vicinity of the outer edge of the wiring board 10. As described herein, the light source portion 100 can be provided on the FPC by using the region over the FPC to a great extent as the wiring board 10 without changing the size of the FPC.

2. Manufacturing Method of Light-Emitting Unit 200

Figure 12:
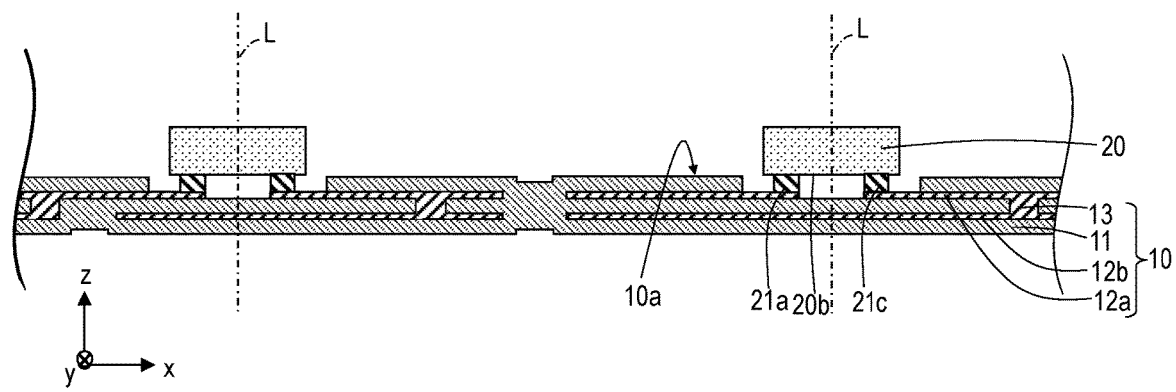
FIG. 12 is a stepwise cross-sectional view for illustrating each production step included in an exemplary manufacturing method of the light-emitting unit 200.
Figure 13:
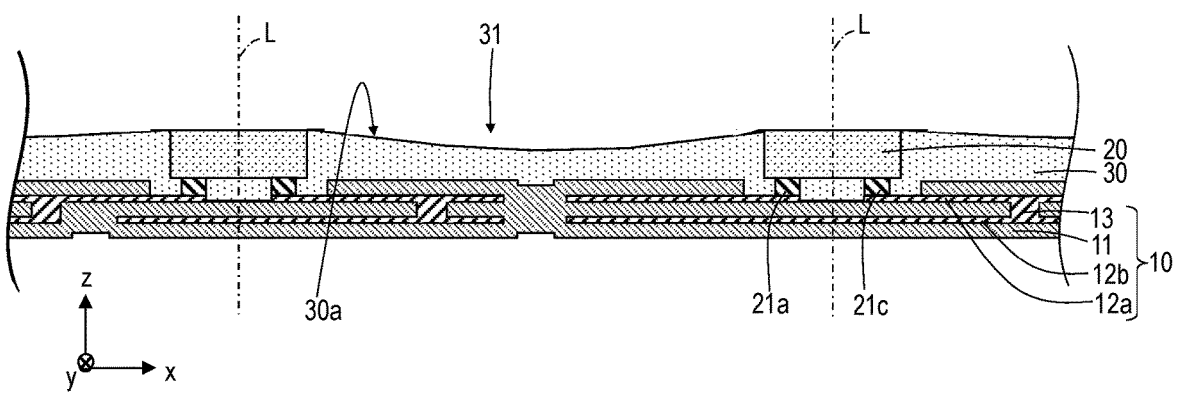
FIG. 13 is a stepwise cross-sectional view for illustrating each production step included in an exemplary manufacturing method of the light-emitting unit 200.
Figure 14:
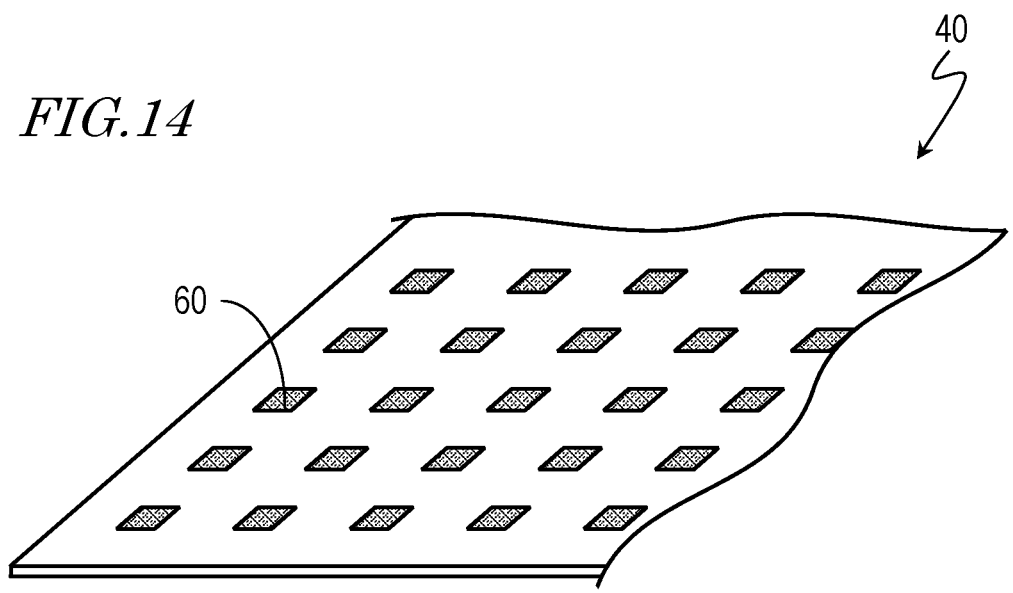
Figure 15:
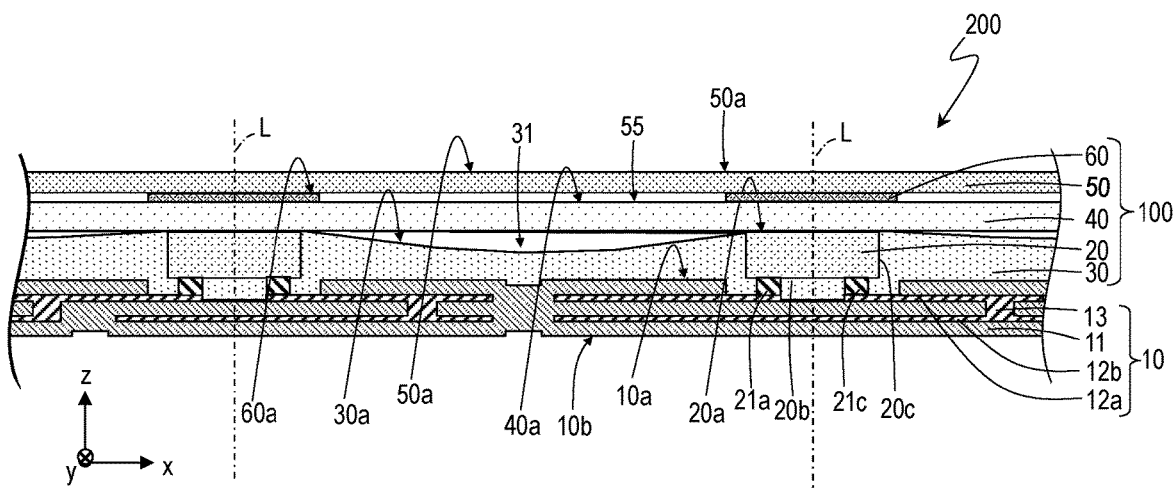
FIG. 15 is a stepwise cross-sectional view for illustrating each production step included in an exemplary manufacturing method of the light-emitting unit 200.
Figure 16:
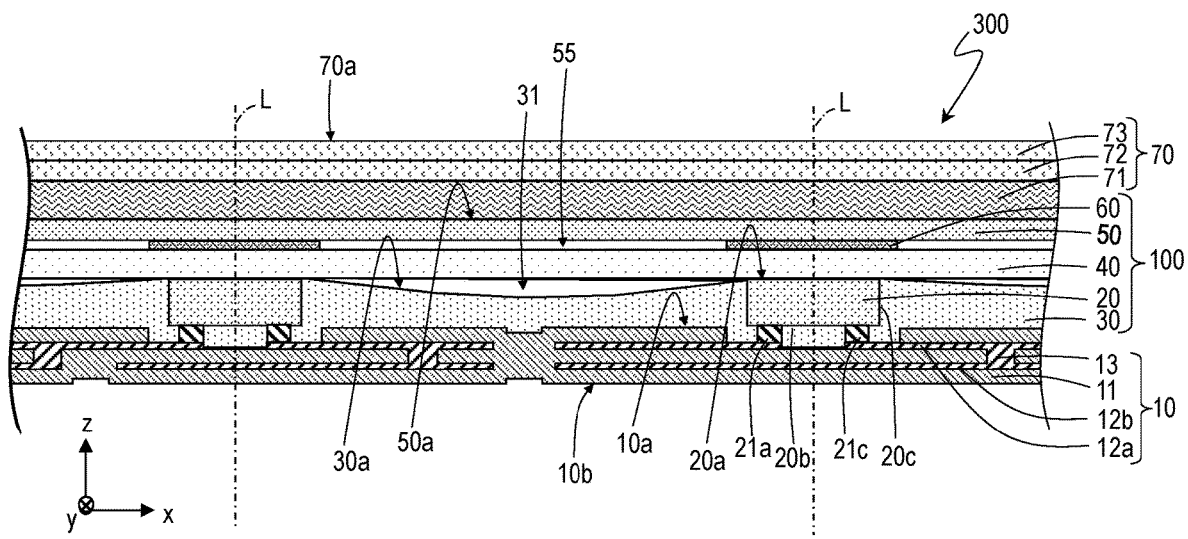
FIG. 16 is a stepwise cross-sectional view for illustrating each production step included in an exemplary manufacturing method of the surface-emission light source 300.

An example of the manufacturing method of the light-emitting unit 200 and an example of the manufacturing method of the surface-emission light source 300 are described with reference to FIG. 11, FIG. 12, FIG. 13, FIG. 14, FIG. 15 and FIG. 16. FIG. 12, FIG. 13 and FIG. 15 show stepwise cross-sectional views for illustrating respective production steps included in the manufacturing method of the light-emitting unit 200. FIG. 16 shows a stepwise cross-sectional view for illustrating a production step included in the manufacturing method of the surface-emission light source 300.

For example, an FPC as the wiring board 10 and a plurality of light-emitting elements 20 are provided. Then, as shown in FIG. 12, the light-emitting elements 20 are mounted to the wiring board 10. From the viewpoint of improving the bonding strength of the light-emitting elements 20 to the wiring board 10, an under fill can be supplied in the space between the lower surface 20b of the light-emitting elements 20 and the upper surface 10a of the wiring board 10.

Then, the wiring board 10 with the light-emitting elements 20 mounted thereto is placed in a mold and a photocurable resin material is supplied into the mold by, for example, potting. The resin material applied onto the wiring board 10 is irradiated with ultraviolet light and cured, whereby a light reflecting member 30 can be formed so as to cover the lateral surfaces of each of the plurality of light-emitting elements 20 as shown in FIG. 13. In this step, for example, a recess 31 can be formed in the surface of the resin material in the form of a sink mark resulting from curing of the resin material. Note that, by mounting a circuit element 25 to the wiring board 10 before the light reflecting member 30 is formed, the light-emitting unit 200E illustrated in FIG. 9 can be produced.

Then, the light diffusing layer 40 and the wavelength conversion layer 50 which are in the form of a sheet are provided. For example, a resin material in which a light diffuser is dispersed is injected into a mold and cured, whereby a light diffusing layer in the form of a sheet is produced. Likewise, a resin material in which particles of a phosphor or the like are dispersed is injected into a mold and cured, whereby a wavelength conversion layer 50 in the form of a sheet can be produced.

On either of the light diffusing layer 40 and the wavelength conversion layer 50 which are in the form of a sheet, for example, at predetermined positions on one principal surface of the light diffusing layer 40, a plurality of light reflecting layers 60 are formed. For example, an uncured resin material in which particles of a reflector are dispersed is applied to predetermined regions of one principal surface of the light diffusing layer 40 by a printing method, an ink jet method, or the like. In this step, the resin material may be applied in the form of a plurality of dots to predetermined regions on the light diffusing layer 40. Thereafter, the resin material is cured, whereby a plurality of light reflecting layers 60 can be formed at the predetermined positions on the light diffusing layer 40 as shown in FIG. 14. When the resin material is applied in the form of a plurality of dots to respective regions on the light diffusing layer 40, light reflecting layers 60 which have a reflection pattern in the form of dots in respective regions on the light diffusing layer 40 can be formed by curing the resin material. According to the density of the dots, the reflectance or transmittance of light in each of the light reflecting layers 60 can be controlled.

Then, an adhesive agent is applied to the upper surface 20a of each of the light-emitting elements 20, and a light diffusing layer 40 is placed above the plurality of light-emitting elements 20 such that the light reflecting layer 60 overlaps the emission surface 20a when viewed in plan. When the light diffusing layer 40 is placed above the plurality of light-emitting elements 20 by any other method, for example, securing with the use of a frame, it is probable that the adhesive agent does not intervene between the light-emitting elements 20 and the light diffusing layer 40.

In this case, as shown in FIG. 15, one of the principal surfaces of the light diffusing layer 40 on which the light reflecting layers 60 are not provided faces the light reflecting member 30. Also, the light diffusing layer 40 is placed on the light reflecting member 30 such that the center of the region of each of the light reflecting layers 60 is present on the optical axis L of a corresponding one of the light-emitting elements 20. When the area of the region of each of the light reflecting layers 60 is greater than the area of the emission surface 20a, the requirement on the alignment accuracy of the light diffusing layer 40 can be relaxed.

Then, the wavelength conversion layer 50 is placed above the light diffusing layer 40. For example, an adhesive agent is applied to the upper surface 40a side of the light diffusing layer 40 so as to at least cover the plurality of light reflecting layers 60 on the upper surface 40a of the light diffusing layer 40, and the light diffusing layer 40 and the wavelength conversion layer 50 are stacked up with the plurality of light reflecting layers 60 interposed therebetween. In this step, the space 55 between the light diffusing layer 40 and the wavelength conversion layer 50 can be filled with the adhesive agent. When the adhesive agent is selectively applied to the upper surface 60a of each of the plurality of light reflecting layers 60 and the light diffusing layer 40 and the wavelength conversion layer 50 are stacked up, an air layer is formed in the space 55. Through the foregoing process, the light-emitting unit 200 is manufactured.

When necessary, an optical member such as a diffuser is provided on or above the wavelength conversion layer 50. For example, the periphery of the wiring board 10 and the light-emitting unit 200 is covered with the tape 80 as shown in FIG. 11. In this case, along the rim of the wavelength conversion layer 50 of the light-emitting unit 200, part of the tape 80 is provided on the upper surface 50a of the wavelength conversion layer 50. Thereby, a frame-like adhesive layer can be formed on the upper surface 50a of the wavelength conversion layer 50. Then, the frame 90 is secured onto the light-emitting unit 200 by the adhesive layer.

Then, as shown in FIG. 11 and FIG. 16, the light-transmitting multilayer structure 70 is placed on or above the wavelength conversion layer 50 of the light-emitting unit 200, and the light-transmitting multilayer structure 70 is fixed to the light-emitting unit 200 by the frame 90. In the light-transmitting multilayer structure 70, for example, a prism film manufactured by 3M (model number: BEF4 DML) can be used as the prism film 72, and a prism film manufactured by 3M (model number: TBEF2-DT-LS) can be used as the prism film 73. Thereafter, a frame-like tape 81 is attached along the border 70s between the frame 90 and the light-transmitting multilayer structure 70 at the upper surface side of the light-transmitting multilayer structure 70. Instead of fixing with the use of the frame 90, the light-transmitting multilayer structure 70 can be fixed onto the wavelength conversion layer by laser welding. Through the foregoing process, the surface-emission light source 300 is manufactured.

A light-emitting unit of an embodiment of the present disclosure may be manufactured and sold as a part of the surface-emission light source 300. For example, a manufacturer who purchases the light-emitting unit (e.g., the light-emitting unit 200) from a supplier can manufacture and sell a surface-emission light source which includes a light-emitting unit by assembling a light-emitting unit of an embodiment of the present disclosure and the other constituents, including the light-transmitting multilayer structure 70, according to the above-described method. Such a surface-emission light source can be suitably used as, for example, a backlight light source of a liquid crystal display device.

A light-emitting unit and a surface-emission light source of the present disclosure are applicable to a backlight light source of a liquid crystal display and various lighting devices.

While certain embodiments of the present invention have been described with respect to exemplary embodiments thereof, it will be apparent to those skilled in the art that the disclosed invention can be modified in numerous ways and can assume many embodiments other than those specifically described above. Accordingly, it is intended by the appended claims to cover all modifications of the invention that fall within the true spirit and scope of the invention.

The invention claimed is:

1. A light-emitting unit comprising:
   a wiring board;
   a plurality of light-emitting elements provided on the wiring board and electrically coupled with a wire layer of the wiring board;
   a light reflecting member provided on the wiring board, the light reflecting member at least including a portion located between two adjacent light-emitting elements;
   a light diffusing layer covering the plurality of light-emitting elements and the light reflecting member;
   a wavelength conversion layer located on or above the light diffusing layer; and
   a plurality of light reflecting layers located between the light diffusing layer and the wavelength conversion layer, each of the light reflecting layers being located above a corresponding one of the plurality of light-emitting elements,
   wherein a vertical space exists between the wavelength conversion layer and a region of an upper surface of the light diffusing layer exclusive of regions overlapping the light reflecting layers in a plan view.

2. The light-emitting unit of claim 1, wherein
   each of the plurality of light reflecting layers has a dotted reflection pattern in a top view, and
   in each of the plurality of light reflecting layers, a dot density of the reflection pattern increases from a periphery to a center of the light reflecting layer.

3. The light-emitting unit of claim 1, wherein an upper surface of the light reflecting member has a recess which includes at least one concave surface.

4. The light-emitting unit of claim 3, wherein a distance between the concave surface and the light diffusing layer increases as a distance from the light-emitting elements increases when viewed in plan.

5. The light-emitting unit of claim 1, wherein a region of each of the light reflecting layers has a circular or rectangular shape when viewed in plan and includes an emission surface of a corresponding one of the plurality of light-emitting elements.

6. The light-emitting unit of claim 1, wherein the wiring board is a flexible printed circuit.

7. The light-emitting unit of claim 1, wherein
   the wavelength conversion layer includes a plurality of first regions and a second region surrounding the plurality of first regions, each of the first regions and the second region containing a phosphor,
   a density of the phosphor in the first regions is higher than a density of the phosphor in the second region, and
   each of the first regions is located above a corresponding one of the plurality of light-emitting elements.

8. The light-emitting unit of claim 7, wherein a thickness of the wavelength conversion layer is greater in the first regions than in the second region.

9. The light-emitting unit of claim 1, wherein
   the wavelength conversion layer includes a plurality of first regions and a second region surrounding the plurality of first regions, each of the first regions and the second region containing a phosphor,
   a thickness of the wavelength conversion layer is greater in the first regions than in the second region, and
   each of the first regions is located above a corresponding one of the plurality of light-emitting elements.

10. The light-emitting unit of claim 9, wherein
    the wavelength conversion layer includes a second wavelength conversion layer provided on each of the first regions, and
    a density of the phosphor in the second wavelength conversion layer is higher than a density of the phosphor in a remaining part of the wavelength conversion layer.

11. A surface-emission light source comprising:
    the light-emitting unit as set forth in claim 1;
    a diffuser provided on or above the wavelength conversion layer; and
    a prism sheet provided on or above the diffuser.

12. A light-emitting unit comprising:
    a wiring board;
    a plurality of light-emitting elements provided on the wiring board and electrically coupled with a wire layer of the wiring board;
    a light reflecting member provided on the wiring board, the light reflecting member at least including a portion located between two adjacent light-emitting elements;
    a light diffusing layer covering the plurality of light-emitting elements and the light reflecting member;
    a wavelength conversion layer located on or above the light diffusing layer; and
    a plurality of light reflecting layers each being located above a corresponding one of the plurality of light-emitting elements,
    wherein the light diffusing layer is a multi-layer structure that includes a first light diffusing layer, a second light diffusing layer and a third light diffusing layer which are arranged in this order from the wiring board toward the wavelength conversion layer,
    wherein the plurality of light reflecting layers are located between the first light diffusing layer and the second light diffusing layer, and
    wherein a vertical space exists between the second light diffusing layer and a region of an upper surface of the first light diffusing layer exclusive of regions overlapping the light reflecting layers in a plan view.

13. The light-emitting unit of claim 12, wherein
each of the plurality of light reflecting layers has a dotted reflection pattern in a top view, and
in each of the plurality of light reflecting layers, a dot density of the reflection pattern increases from a periphery to a center of the light reflecting layer.

14. The light-emitting unit of claim 12, wherein an upper surface of the light reflecting member has a recess which includes at least one concave surface.

15. The light-emitting unit of claim 14, wherein a distance between the concave surface and the light diffusing layer increases as a distance from the light-emitting elements increases when viewed in plan.

16. The light-emitting unit of claim 12, wherein a region of each of the light reflecting layers has a circular or rectangular shape when viewed in plan and includes an emission surface of a corresponding one of the plurality of light-emitting elements.

17. The light-emitting unit of claim 12, wherein the wiring board is a flexible printed circuit.

18. The light-emitting unit of claim 12, wherein the plurality of light reflecting layers are provided on an upper surface of the first light diffusing layer.

19. The light-emitting unit of claim 12, wherein
the wavelength conversion layer includes a plurality of first regions and a second region surrounding the plurality of first regions, each of the first regions and the second region containing a phosphor,
a density of the phosphor in the first regions is higher than a density of the phosphor in the second region, and
each of the first regions is located above a corresponding one of the plurality of light-emitting elements.

20. The light-emitting unit of claim 19, wherein a thickness of the wavelength conversion layer is greater in the first regions than in the second region.

21. The light-emitting unit of claim 12, wherein
the wavelength conversion layer includes a plurality of first regions and a second region surrounding the plurality of first regions, each of the first regions and the second region containing a phosphor,
a thickness of the wavelength conversion layer is greater in the first regions than in the second region, and
each of the first regions is located above a corresponding one of the plurality of light-emitting elements.

22. The light-emitting unit of claim 21, wherein
the wavelength conversion layer includes a second wavelength conversion layer provided on each of the first regions, and
a density of the phosphor in the second wavelength conversion layer is higher than a density of the phosphor in a remaining part of the wavelength conversion layer.

23. A surface-emission light source comprising:
the light-emitting unit as set forth in claim 12;
a diffuser provided on or above the wavelength conversion layer; and
a prism sheet provided on or above the diffuser.

* * * * *